(12) United States Patent
Wang et al.

(10) Patent No.: US 7,973,310 B2
(45) Date of Patent: Jul. 5, 2011

(54) SEMICONDUCTOR PACKAGE STRUCTURE AND METHOD FOR MANUFACTURING THE SAME

(75) Inventors: David Wei Wang, Hsinchu (TW); An-Hong Liu, Hsinchu (TW); Hao-Yin Tsai, Hsinchu (TW); Hsiang-Ming Huang, Hsinchu (TW); Yi-Chang Lee, Hsinchu (TW); Shu-Ching Ho, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 230 days.

(21) Appl. No.: 12/501,100

(22) Filed: Jul. 10, 2009

(65) Prior Publication Data

US 2010/0007001 A1      Jan. 14, 2010

Related U.S. Application Data

(60) Provisional application No. 61/079,900, filed on Jul. 11, 2008.

(30) Foreign Application Priority Data

Jan. 6, 2009 (TW) .............................. 98100219 A

(51) Int. Cl.
*H01L 23/58* (2006.01)
(52) U.S. Cl. .................. 257/48; 257/777; 257/E21.597; 257/E23.174; 438/15; 438/109

(58) Field of Classification Search .................... 257/48, 257/777, E21.597, E23.174; 438/15, 109
See application file for complete search history.

(56) References Cited

U.S. PATENT DOCUMENTS

| | | | |
|---|---|---|---|
| 2007/0222050 A1 | 9/2007 | Lee et al. | |
| 2008/0272372 A1* | 11/2008 | Luo et al. | 257/48 |
| 2009/0294916 A1* | 12/2009 | Ma et al. | 257/621 |
| 2011/0045636 A1* | 2/2011 | Chung | 438/109 |

FOREIGN PATENT DOCUMENTS

CN           101038908 A      9/2007

* cited by examiner

*Primary Examiner* — Trung Dang
(74) *Attorney, Agent, or Firm* — Muncy, Geissler, Olds & Lowe, PLLC

(57) ABSTRACT

Semiconductor package structures and methods for manufacturing the same are provided. The semiconductor package structure comprises a substrate unit and a first chip stack structure. The substrate unit comprises a circuit structure having test pads. The first chip stack structure comprises chips, and each of the chips has a plurality of through silicon plugs. The through silicon plugs of two adjacent chips are electrically connected and further electrically connected to the test pads of the substrate unit for electrical testing. Another semiconductor package structure provided by the present invention comprises a first semiconductor chip and a second semiconductor chip. Each of the semiconductor chips has test pads for electrical testing and a plurality of through silicon plugs connecting to the test pads. The second semiconductor chip is mounted on the first semiconductor chip, and a portion of the through silicon plugs of two semiconductor chips are electrically connected with each other.

44 Claims, 18 Drawing Sheets

SEMICONDUCTOR PACKAGE STRUCTURE AND METHOD FOR MANUFACTURING THE SAME

This application claims priorities to Taiwan Patent Application No. 098100319 filed on Jan. 6, 2009, and U.S. Provisional Application No. 61/079,900 filed on Jul. 11, 2008, the disclosures of which are incorporated herein by reference in their entirety

CROSS-REFERENCES TO RELATED APPLICATIONS

Not applicable.

BACKGROUND OF THE INVENTION

1. Field of the Invention

The present invention provides a semiconductor package structure, a method for manufacturing the same. In particular, the present invention provides a semiconductor package structure comprising chips which are vertically stacked and electrically interconnected by through silicon plugs to a substrate unit using ultrasonic bonding methods. Additionally, test pads can be provided on the substrate unit or the chip to facilitate in process control. Also a method is disclosed that utilizes existing infrastructure thereby reducing cost.

2. Descriptions of the Related Art

The trend in advanced semiconductor packaging has been to reduce the form factor while improving electrical performance. This enables products for industry and consumers that are faster, cheaper and smaller. A common example is stacking of memory chips in a semiconductor package by using conventional materials and processes to assemble and test the resulting multi-chip package. Typically the electrical connections between the various stacked chips and the substrate [unit] are made by wire bonding. Stacking different types of chips is also possible but at the cost of greater electrical, thermal and mechanical complexity as well as the difficulties to achieve high yields with increased system level complexity within the package.

Through silicon vias (TSVs), or more accurately, through silicon plugs (TSPs) are a popular alternative approach to achieve higher levels of integration and form factor reduction for advanced semiconductor packaging. As the name implies, the electrical connection of the back and front of a semiconductor device enables the possibility of vertically assembling multiple chips in a package where previously only one chip was present. Accordingly, more semiconductor devices can be integrated into a smaller form factor. In addition, different types of semiconductor chips can be also integrated in a single package to create a so-called system in a package (SIP). Irrespective of the approach, the footprint of multiple packages in the printed circuit board is reduced which also reduces final product cost. Finally, interconnecting the chips by using TSPs can decrease the number of electrical connections necessary to the substrate [unit] since one substrate connection can service multiple chips. This also helps to simplify the assembly process and improve yield.

TSPs are also compatible with the more stringent signaling requirements necessary to achieve high performance. TSPs can be designed in with materials, shapes and sizes to provide high conductivity low inductance connections between the stacked chip and within the package and thereby facilitate efficient power delivery and improved signal quality. Additionally, the use of TSP structures decreases the need for complicated wire bonding of stacked chip because each chip need not be electrically connected to the substrate [unit] independently as is currently the case for memory devices in mass production of stacked packages. Also, since wire bonding has inductive properties that degrade the quality of electrical signals, especially at high frequencies; their removal improves the signal quality at a given frequency. Alternatively, higher signaling frequencies may be possible with the improved signal quality resulting from eliminating of parasitic inductance in a semiconductor device and package that is indeed smaller and faster.

Typically, high performance and small form factor packages are costly to manufacture. This is particularly the case when considering the use of TSPs to create three dimensional semiconductor devices within one package. For instance there are disparate competing approaches to implement stacked chips that use TSPs. For instance, there is so-called chip on chip (CoC) approaches where tested and singulated chips are arranged in a stacked configuration. Alternatively, there are wafer to wafer (WoW) schemes that contemplate stacking the chip in wafer form before singulation and with the anticipated yield loss when a good chip and bad chip on the corresponding wafers are vertically stacked together. Yet another approach is to stack a singulated Chip-on-Wafer (CoW), in a location where a good chip has been previously identified.

Implementation of each approach requires changes to the manufacturing process. As a preliminary matter, the process and location of making the TSV is unclear ranging from plasma etching to laser drilling. Some processes may be more suitable for implementation in the front-end semiconductor FAB that fabricates the integrated circuit while other approaches may be better suited for implementation in the back-end package and assembly factory. Additionally, there is no general approach to the TSP bonding method. For instance the electrical connections between stacked chips can be made by a variety of technologies such direct oxidizing fusion bonding, Cu—Cu bonding, Au—Au bonding, Au—Sn bonding, adhesion bonding or surface activation bonding. New process and materials increase the complexity and yield loss in the implementation of stacked chip using TSP with resulting increases in cost.

Irrespective of the process and integration choices that are made, there is considerable risk and uncertainty in implementation. As a result of increased complexity and possible yield loss, stacked packages using TSPs will be more expensive to fabricate. Consequently, TSP development has tended to focus on high performance systems that can command price premiums to offset the cost and complexity of the processes needed to construct stacked package using TSPs. Consequently, it is necessary to minimize the cost with the corresponding risk associated with its applications to adapt and to facilitate TSPs to the existing infrastructure and processes and to cost sensitive markets with wider implementations.

SUMMARY OF THE INVENTION

One objective of this invention is to provide a semiconductor package structure, which comprises a substrate unit and a first chip stack structure. The substrate unit comprises a top surface, a bottom surface, a circuit structure formed on the top surface of the substrate unit formed, and a chip mounting area also defined upon the top surface of the substrate unit. The circuit structure has a plurality of bonding pads and a plurality of test pads, and each of the bonding pads is arranged within the chip mounting area and connected to each of the test pads. Alternatively, the test pads may function as terminals for permanent electrical connections or signals input for redundancy repair for a memory semiconductor chips. The first chip stack structure comprises a plurality of chips, and each of the chips has an upper surface, a bottom surface opposite to the upper surface, and a plurality of through silicon plugs to form electrical interconnections between the upper surface and the bottom surface. Each of the through silicon plugs comprises a first electrode jutting out from one of the upper surface or the bottom surface, and the plurality of through silicon plugs of two adjacent chips are electrically connected through the first electrodes respectively. The first chip stack structure is mounted on the chip mounting area of the substrate unit, at least a portion of the through silicon plugs are electrically connected to the bonding pads, and the plurality of test pads are arranged outside of the chip mounting area. Electrical connections to the TSPs are accomplished with appropriate bonding processes.

Another object of this invention is to disclose a method for manufacturing a semiconductor package structure. The manufacturing method comprises the steps of: providing a substrate, the substrate comprising a plurality of substrate units, each of the substrate units comprising a circuit structure and a chip mounting area defined thereupon, the circuit structure having a plurality of bonding pads and a plurality of test pads, each of the bonding pads being arranged within the chip mounting area and connected to each of the test pads and the test pads being arranged outside of the chip mounting area; forming a first sealing layer on the chip mounting area; attaching a first chip on the chip mounting area by the first sealing layer, the first chip having a first upper surface, a first bottom surface and a plurality of through silicon plugs disposed therein to form electrical interconnections between the first upper surface and the first bottom surface, each of the through silicon plugs comprising a first electrode jutting out from one of the first upper surface or the first bottom surface; electrically connecting at least a portion of the plurality of through silicon plugs of the first chip to the bonding pads, wherein a space between the first chip and the substrate unit is filled by the first sealing layer; forming a second sealing layer on the first upper surface; attaching a second chip on the first upper surface by the second sealing layer, the second chip having a second upper surface, a second bottom surface and a plurality of through silicon plugs disposed therein to form electrical interconnections between the second upper surface and the second bottom surface, each of the through silicon plugs comprising a second electrode jutting out from one of the second upper surface or the second bottom surface; and electrically connecting at least a portion of the plurality of through silicon plugs of the second chip to the corresponding through silicon plugs of the first chip, wherein a space between the first chip and the second chip is filled by the second sealing layer.

Another exemplary embodiment of this invention discloses a semiconductor package structure, which comprises a first semiconductor chip and a second semiconductor chip. The first semiconductor chip has a first upper surface, a first bottom surface, a plurality of test pads, a first chip mounting area defined on the first upper surface and a plurality of through silicon plugs disposed therein to form electrical interconnections between the first upper surface and the first bottom surface. Each of the through silicon plugs comprises a first electrode jutting out from one of the first upper surface or the first bottom surface, and each of the test pads is arranged outside of the first chip mounting area and connected to each of the through silicon plugs. The second semiconductor chip has a second upper surface, a second bottom surface, a plurality of test pads, a second chip mounting area defined on the second upper surface and a plurality of through silicon plugs disposed therein to form electrical interconnections between the second upper surface and the second bottom surface. Each of the through silicon plugs comprises a second electrode jutting out from one of the second upper surface or the second bottom surface, and each of the test pads is arranged outside of the second chip mounting area and connected to each of the through silicon plugs. The second semiconductor chip is mounted on the first chip mounting area and at least a portion of the plurality of through silicon plugs of the second semiconductor chip are electrically connected to the corresponding through silicon plugs of the first semiconductor chip.

Yet the invention discloses a method for manufacturing a semiconductor package structure. The manufacturing method comprises the steps of: providing a first semiconductor element comprising at least one chip, the at least one chip having a first upper surface, a first bottom surface, a plurality of test pads, a first chip mounting area defined on the first upper surface and a plurality of through silicon plugs disposed therein to form electrical interconnections between the first upper surface and the first bottom surface, each of the through silicon plugs comprising a first electrode jutting out from one of the first upper surface or the first bottom surface, each of the test pads being arranged outside of the first chip mounting area and connected to each of the through silicon plugs; forming a first sealing layer on the first chip mounting area; attaching a second semiconductor element on the first chip mounting area by the first sealing layer, the second semiconductor element having a second upper surface, a second bottom surface, a plurality of test pads, a second chip mounting area defined on the second upper surface and a plurality of through silicon plugs disposed therein to form electrical interconnections between the second upper surface and the second bottom surface, each of the through silicon plugs comprising a second electrode jutting out from one of the second upper surface or the second bottom surface, each of the test pads being arranged outside of the second chip mounting area and connected to each of the through silicon plugs; and electrically connecting at least a portion of the plurality of through silicon plugs of the second semiconductor element to the corresponding through silicon plugs of the first semiconductor element, wherein a space between the first semiconductor element and the second semiconductor element is filled by the first sealing layer.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following descriptions, this invention will be explained with reference to embodiments thereof, which relate to a semiconductor package structure, and a method for manufacturing a semiconductor package structure. However, these embodiments are not intended to limit this invention to any specific environment, applications or particular implementations described in these embodiments. Therefore, descriptions of these embodiments are only for illustration purposes rather than limitation. It should be appreciated that in the following embodiments and the attached drawings, elements unrelated to this invention are omitted from depiction; and dimensional relationships among individual elements in the attached drawings are depicted in an exaggerative way for ease of understanding.

Figure 1A:
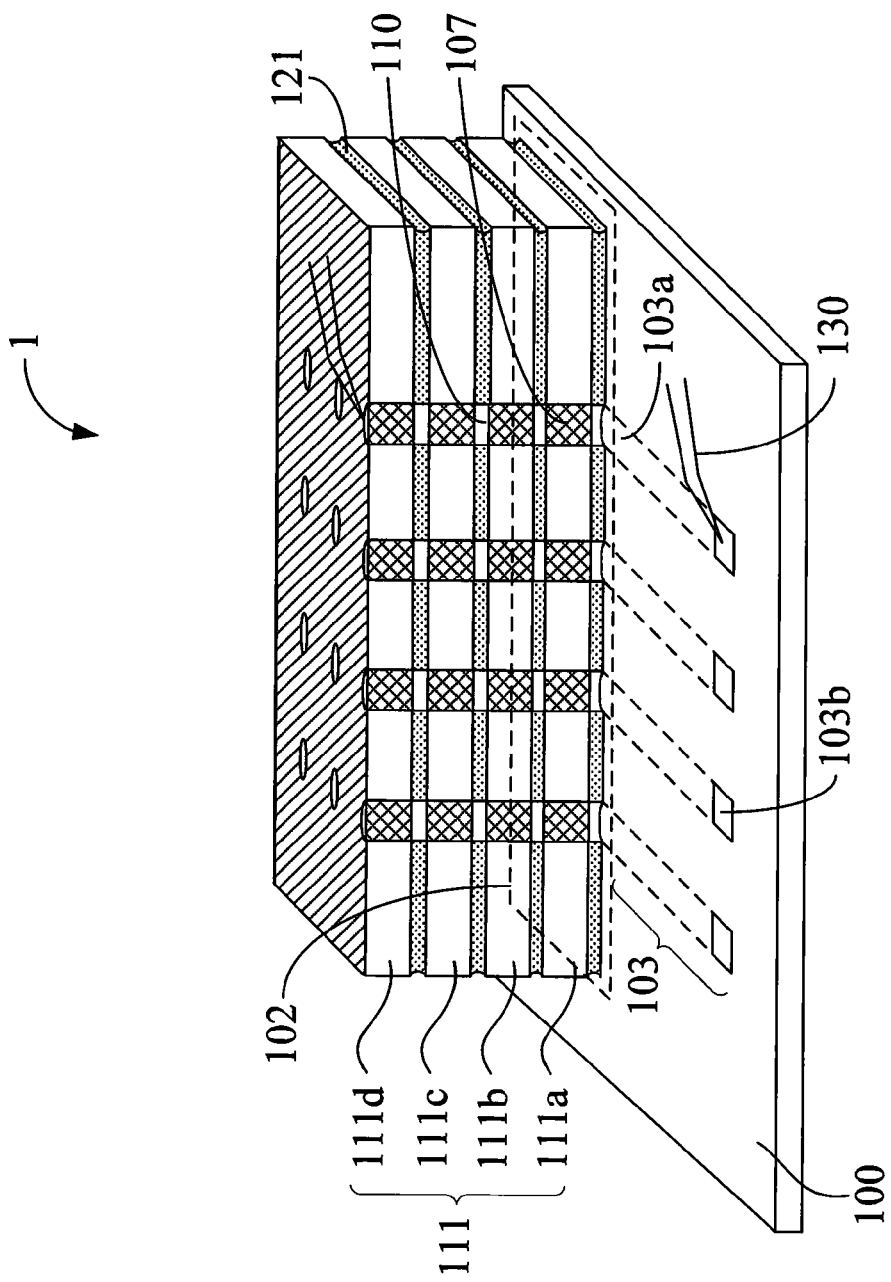
FIG. 1a is a partial cross sectional view of a semiconductor package structure according to the first embodiment of this invention.

FIG. 1a is a partial cross sectional view of a semiconductor package structure 1 according to the first embodiment of this invention. The semiconductor package structure 1 comprises a substrate unit 100, a first chip stack structure 111, and sealing layers 121. The substrate unit 100 has a chip mounting area 102 defined thereupon and a circuit structure 103 formed thereon. The circuit structure 103 has a plurality of connecting circuits 103a, a plurality of test pads 103b, and a plurality of bonding pads (not shown). Each of the bonding pads (not shown) is arranged within the chip mounting area 102, and each of the test pads 103b is arranged outside of the chip mounting area 102. The connecting circuits 103a operatively connect the bonding pads (not shown) and the test pads 103b. In this embodiment, an isolating protection layer (not shown) formed on the substrate unit 100 exposes only the bonding pads and the test pads 103b for external contacts but covers the connecting circuits 103a to eliminate contamination or circuit bridging. In more detail, the isolating protection layer on the substrate unit 100 is a solder mask. However, in other embodiments, the bonding pads, the connecting circuits and the test pads can all remain uncovered by the solder mask.

The first chip stack structure 111 is mounted on the chip mounting area 102 of the substrate unit 100. The first chip stack structure 111 comprises a plurality of chips 111a, 111b, 111c and 111d. Each of the chips 111a, 111b, 111c and 111d has an upper surface, a bottom surface opposite the upper surface, and a plurality of through silicon plugs 107 disposed therein to form electrical interconnections between the upper surface and the bottom surface. Each of the through silicon plugs 107 comprises an bottom electrode 110 jutting out from the bottom surface, and the plurality of through silicon plugs 107 of two adjacent chips are electrically connected through the bottom electrodes 110 respectively. In particular, the through silicon plugs 107 of one of the chips 111a, 111b, 111c and 111d comprise only the bottom electrodes 110. The chip 111b is stacked upon the chip 111a with the bottom electrodes 110 of the chip 111b connecting to the through silicon plugs 107 of the chip 111a correspondingly. The chips 111c and 111d are sequentially stacked up accordingly. Hence, the through silicon plugs 107 of two adjacent chips are securely bonded with each other with the bottom electrodes 110 of the through silicon plugs 107 of the chips 111a, 111b, 111c and 111d.

As can be seen from FIG. 1a, the through silicon plugs 107 of each of the plurality of chips 111a, 111b, 111c and 111d are electrically connected to the through silicon plugs 107 of an adjacent chip through the bottom electrodes 110 respectively. The first chip stack structure 111 is electrically connected to the substrate unit 100 by electrically connecting at least a portion of the through silicon plugs 107 of the chip 111a to the bonding pads (not shown) through the bottom electrodes 110 respectively.

Each of the test pads 103b is electrically connected to each of the bonding pads (not shown) through the connecting circuits 103a, and the through silicon plugs 107 are electrically connected to the bonding pads (not shown). The test circuit pads 103b are arranged outside of the chip mounting area 102. Right after the chip 111a is mounted on the chip mounting area 102 or each of the chips 111b, 111c, 111d is stacked upon, an electrical interconnection test between two components can be executed instantly via applying testing signals to the test pads 103b followed by redundancy repairing if required to increase the yield of the semiconductor package structure 1. Generally, an electrical open/short test can be executed right after every single chip 111a, 111b, 111c and 111d is stacked to detect any electrical interconnection defects between the chip 111a and a substrate unit 100 or between the stacked chips 111a, 111b, 111c, and 111d. A functional test can also be executed after the entire semiconductor package structure 1 is fabricated. The testing signals generated from a testing device such as testing sockets or probes are transmitted to the test pads and the chip under test to obtain the test results. As shown in FIG. 1a, two probes 130 contact one of the through silicon plugs 107 and the corresponding test pad 103b respectively, and a test signal is transmitted from the probes 130 to the semiconductor package structure 1 to evaluate the integrity of the electrical interconnections between each of the chips 111a, 111b, 111c and 111d and the substrate unit 100. Hence, with the test pads 103b arranged outside of the chip mounting area 102, an immediate test of the electrical interconnection integrity for each chip can be implemented so that the stacking of the multiple chips can be suspended for rework or rejected from the process line to eliminate unnecessary waste of manufacturing costs and time to increase overall stacking yield.

Figure 1B:
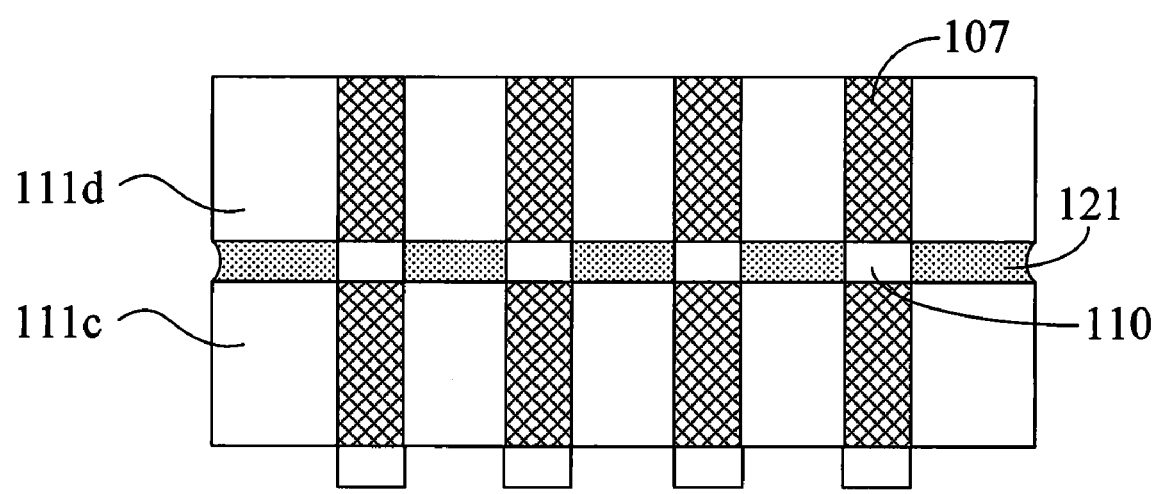
FIG. 1b is a cross sectional view of a part of the first chip stack structure of a semiconductor package structure according to the first embodiment of this invention.

FIG. 1b is a schematic view of a part of the first chip stack structure 111 of a semiconductor package structure 1 of the first embodiment of this invention. The sealing layer 121 formed between two adjacent chips, chips 111c and 111d, for example, to fill a space between the chips 111c, 111d. In this embodiment, the sealing layer 121 is adapted to surround the bottom electrodes 110 so as to protect the electrical interconnects between the chips 111c, 111d from environmental interference and humidity invasion. In addition to forming the sealing layer 121 between chips 111c, 111d, the sealing layer 121 is also formed between the chips 111a of the first chip stack structure 111 and the substrate unit 100 for filling the space therebetween as illustrated in FIG. 1a.

The sealing layer 121 is made of a material selected from the following group: non-conductive paste (NCP), non-conductive film (NCF), anisotropic conductive paste (ACP), anisotropic conductive film (ACF), underfill, non-flow underfill, B-stage gel, molding compound, film-on-wire (FOW), and a combination thereof.

Hereinbelow, material properties of the substrate unit 100 in the above embodiment will be described in detail. Structurally, the substrate unit 100 may be either a single-layer substrate or a multi-layer substrate and is removable so that after completion of the first chip stack structure 1, the substrate unit 100 can be removed with only the first chip stack structure 1 being left.

As to the material, the substrate unit 100 is selected from the following group: an organic substrate, a ceramic substrate, a glass epoxy substrate, a polyimide substrate, a FR-4 substrate, a FR-5 substrate, a fiber-reinforced substrate, a bismaleimide triazine (BT) substrate. Furthermore, the substrate unit 100 may be a flexible membrane selected from the following group: a polyimide film and a Polyethylene terephthalate (PET) film.

The through silicon plugs 107 for electrical interconnections are made of a material selected from a group consisting of Cu, Au, Ag, Sn, Sn/Ag alloy, Sn/Ag/Cu alloy, a lead-free solder, a Ni/Au alloy, a Ni/Pd alloy, a Ni/Pd/Au alloy, W, poly Si, doped Si, conductive polymer and a combination thereof.

Any compatible combination of chip can be used in the first chip stack structure 1. These may include various memory types such as DRAM, Flash, SRAM, PSRAM, EPROM, EEPROM, Mask ROM, LPSDRAM, LPSRAM, etc and may also include controllers suitable for the integration of the first chip stack functionality into the package.

Figure 2:
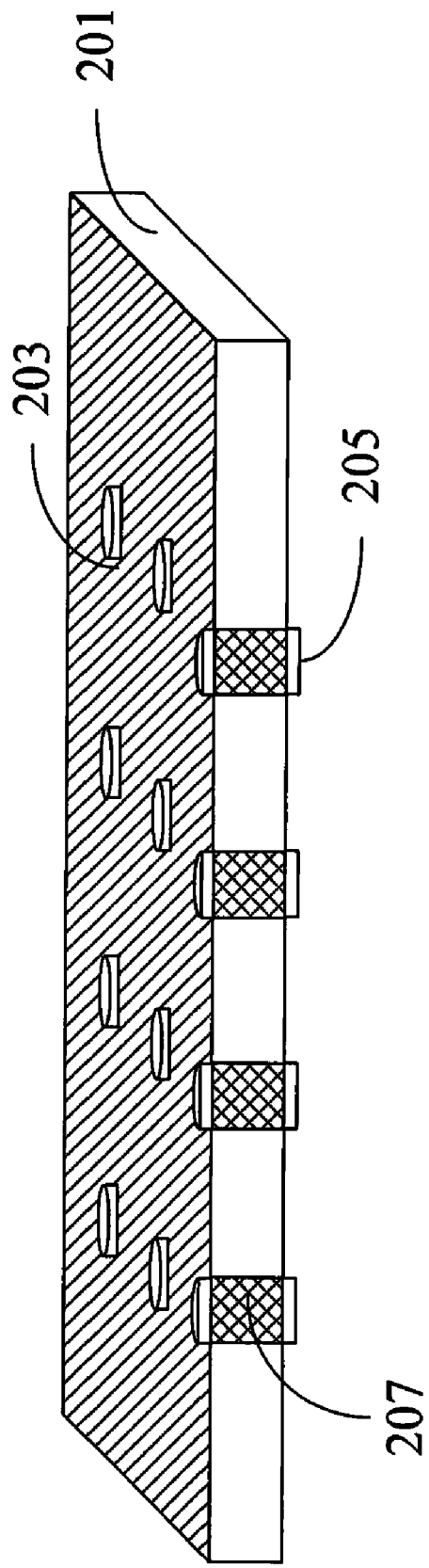
FIG. 2 is a schematic view of a chip which may be applied to the first embodiment of this invention.

FIG. 2 is a schematic view of a chip 201 which may be applied to the first chip stack structure 111 of the semiconductor package structure 1 of the first embodiment of this invention, and the chip 201 may replace at least one of the chips 111a, 111b, 111c and 111d. The chip 201 is adapted for use in the semiconductor package structure of this invention. In this aspect, the chip 201 comprises a plurality of through silicon plugs 207, each of which comprises an upper electrode 203 jutting out from the upper surfaces of the chip 201 and aligned with the through silicon plug 207 and a bottom electrode 205 jutting out from the bottom surfaces of the chip 201 and aligned with the through silicon plug 207. The through silicon plugs 207 of the chip 201 comprise both the upper electrodes 203 and the bottom electrodes 205, which is apparently different from the through silicon plugs 107 which have only the bottom electrodes 110 jutting out from the bottom surfaces of the chips 111a, 111b, 111c and 111d recited in the first embodiment. With the aforementioned structure, when the chip 201 is to be stacked with an adjacent chip 201, the through silicon plugs 207 of the two stacked chips 201 are adapted to be electrically connected to each other through interconnections of the upper electrodes 203 and the bottom electrodes 205. By using the electrodes, connections between the through silicon plugs can be made more secure to improve the yield of the bonding process.

The aforementioned interconnections of the electrodes of two adjacent chips are implemented by a bonding process chosen from a group comprising thermo-compressing, thermo-sonic bonding, ultrasonic bonding, or a combination thereof. As recited above, the upper electrodes and the bottom electrodes are elements formed on or under the through silicon plugs separately. However, either the upper electrodes or the bottom electrodes or both of them can be portions of the through silicon plugs (i.e. the electrodes and the through silicon plugs are formed integral) in other embodiments.

The first electrodes and the second electrodes are plated bumps, electroless plated bumps, stud bumps, conductive polymer bumps, or metal composite bumps made of a material selected from the group of: Cu, Au, Ag, In, Ni/Au, Ni/Pd/Au, Cu/Ni/Au, Cu/Au, Al and a combination thereof that are commonly known to one skilled in the art.

Figure 3:
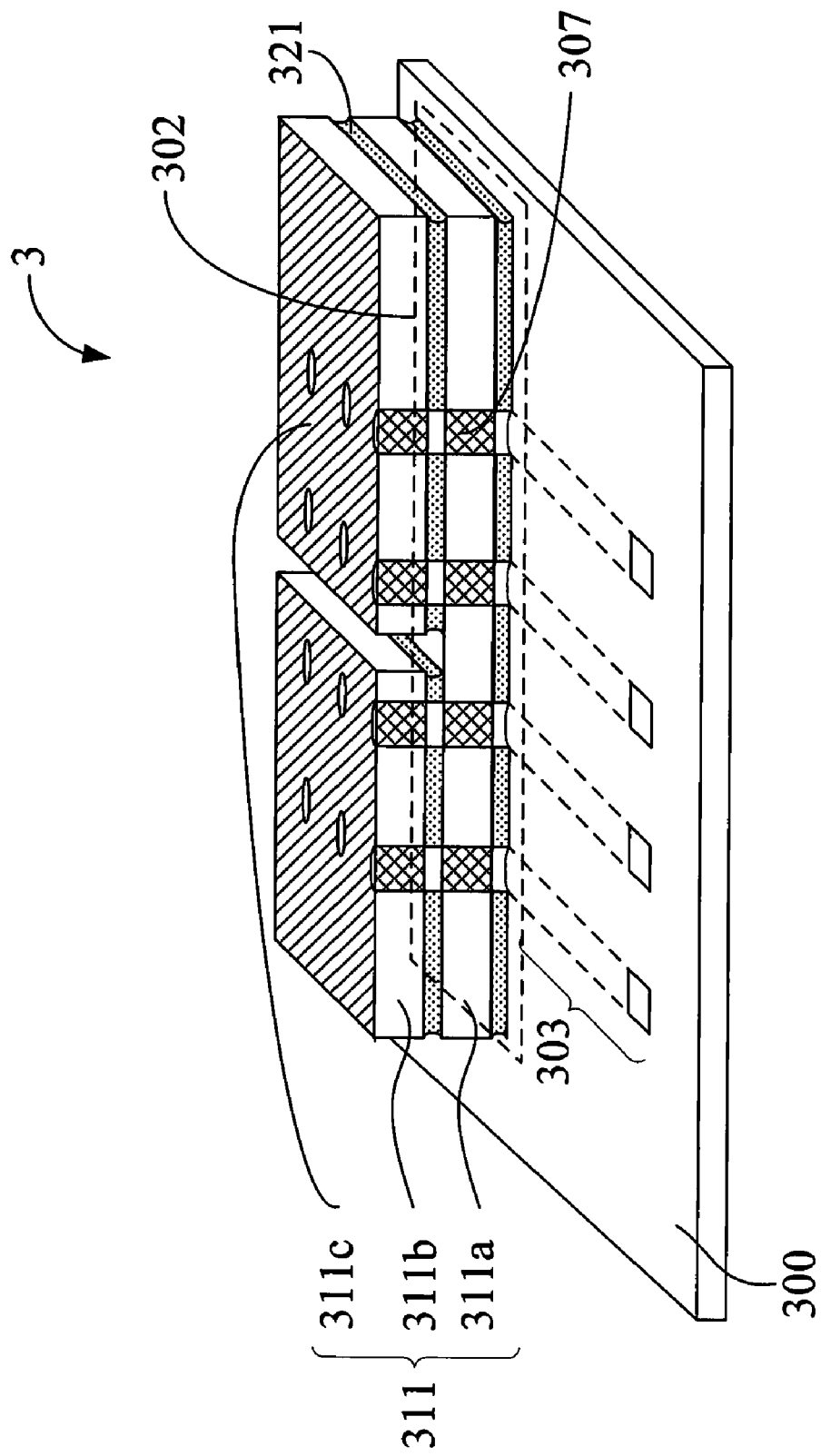
FIG. 3 is a partial cross sectional view of a semiconductor package structure according to the second embodiment of this invention.

FIG. 3 is a partial cross sectional view of a semiconductor package structure 3 according to the second embodiment of this invention. The semiconductor package structure 3 comprises a substrate unit 300, a first chip stack structure 311, and sealing layers 321. The substrate unit 300 comprises a chip mounting area 302 defined thereupon and a circuit structure 303 formed thereon. The first chip stack structure 311 is mounted on the chip mounting area 302 of the substrate unit 300. The first chip stack structure 311 comprises a plurality of chips 311a, 311b, and 311c, and each of the chips 311a, 311b, and 311c has an upper surface, a bottom surface opposite the upper surface, and a plurality of through silicon plugs 307 disposed therein to form electrical interconnections between the upper surface and the bottom surface.

The most prominent difference from the first embodiment is that the second chip 311b and the third chip 311c are both mounted on and electrically connected to the adjacent first chip 311a respectively through the electrical interconnections of a plurality of through silicon plugs 307. Similar to the first embodiment, the first chip stack structure 311 is electrically connected to the substrate unit 300. The sealing layers 321 are formed between the first chip 311a and the second chip 311b, between the first chip 311a and the third chip 311b, and between the first chip 311a and the substrate unit 300. The semiconductor package structure 3 of the third embodiment is applicable to a memory device mainly to increase the memory capacity density (i.e., to increase the memory capacity by stacking chips) and to improve the performance of electrical connections between the chip and the memory device. When applied in such a memory device, the second chip 311b and the third chip 311c may have the same size and/or the same functions; alternatively, they may also have different sizes and/or different functions. The detail description of the primary elements and the materials of the sealing layers 321, the through silicon plugs 307, and the substrate unit 300 are depicted in the first embodiment and the related descriptions are omitted here. Testing of the electrical interconnection integrity of the through silicon plugs 307 between the first chip 311a and the second chip 311b, between the first chip 311a and the third chip 311c, and between the first chip 311a and the substrate unit 300 is depicted in the first embodiment and related descriptions are omitted here.

Figure 4:
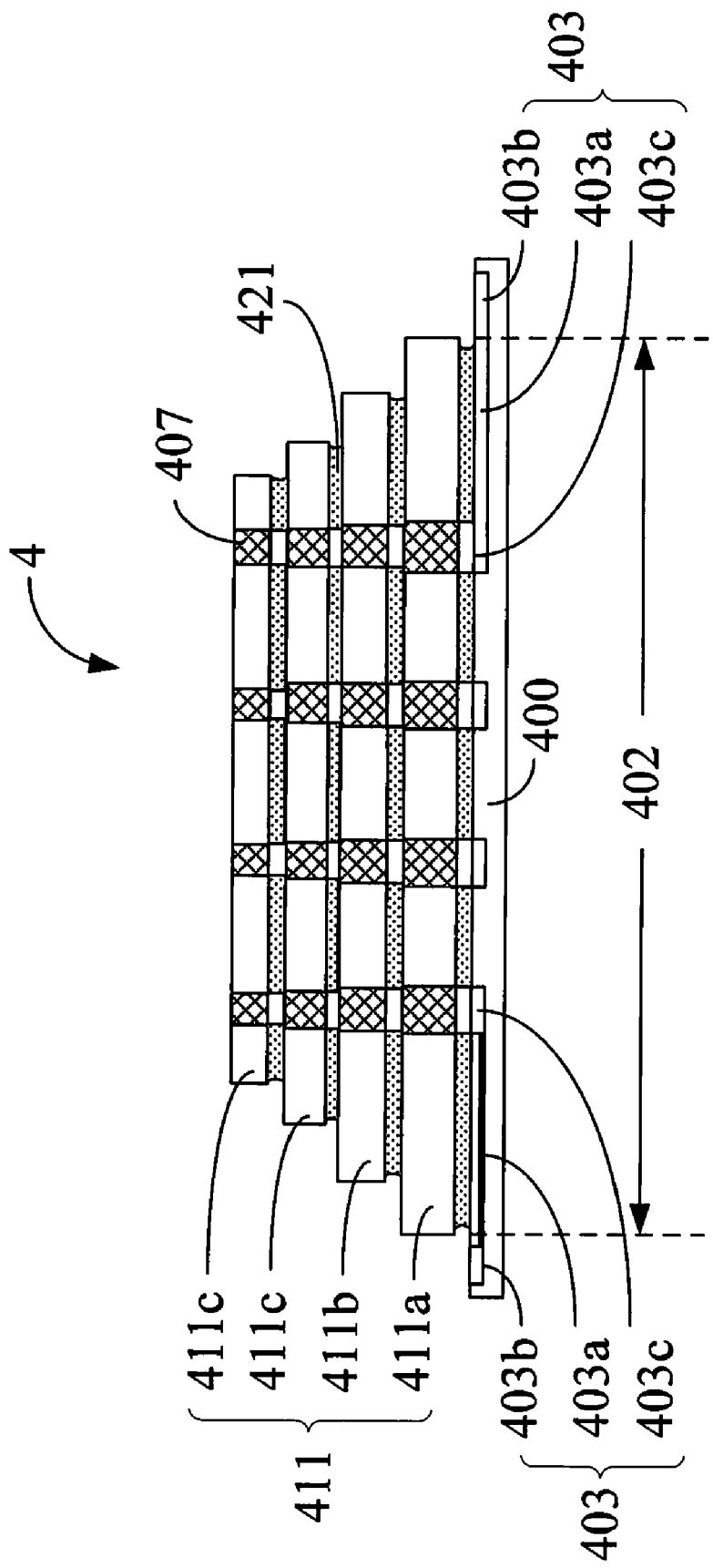
FIG. 4 is a cross sectional view of a semiconductor package structure according to the third embodiment of this invention.

FIG. 4 is a cross sectional view of a semiconductor package structure 4 according to the third embodiment of this invention. The semiconductor package structure 4 comprises a substrate unit 400, a first chip stack structure 411, and sealing layers 421. The substrate units 400 has a chip mounting area 402 defined thereupon and a circuit structure 403 formed thereon. The circuit structure 403 has a plurality of connecting circuits 403a, a plurality of test pads 403b, and a plurality of bonding pads 403c. The most prominent difference from the first embodiment is that the first chip stack structure 411 comprises a first chip 411a, a second chip 411b, a third chip 411c and a fourth chip 411d, which have different sizes and different functions from each other. Through silicon plugs 407 of each of the chips 411a, 411b, 411c and 411d are electrically connected to the through silicon plugs 407 of an adjacent chip respectively. The detail description of the primary elements and the materials of the sealing layers 421, the through silicon plugs 407, and the substrate unit 400 are depicted in the first embodiment and the related descriptions are omitted here.

More particularly, the fourth embodiment illustrates two different appearances of the circuit structure 403. In FIG. 4, the through silicon plugs 407 are electrically connected to the bonding pads 403c which are connected to the test pads 403b through the connecting circuits 403a. According to the left portion of FIG. 4, the connecting circuits 403a are covered with an isolating protection layer (not shown) formed on the substrate unit 400, which may be a solder mask, in the same way as described in the first embodiment. According to the right portion of FIG. 4, however, the connecting circuits 403a are not covered by the isolating protection layer; in other words, the connecting circuits 403a, the test pads 403b, and the bonding pads 403c are exposed from the isolating protection layer. Testing of the electrical interconnection integrity of the through silicon plugs 407 between each two of the chips 411a, 411b, 411c and 411d and between the first chip 411a and the substrate unit 400 is depicted in the first embodiment and related descriptions are omitted here.

Figure 5:
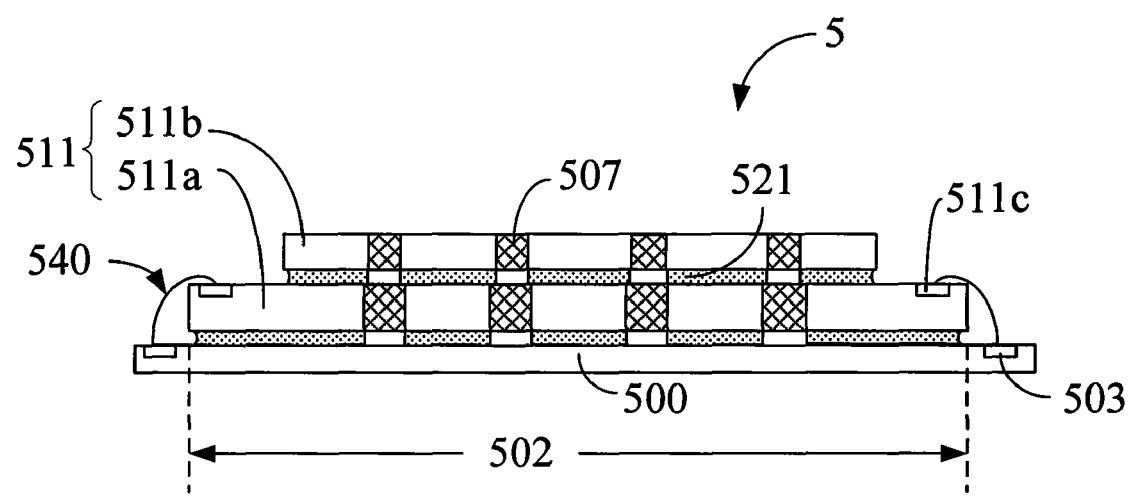
FIG. 5 is a cross sectional view of a semiconductor package structure according to the fourth embodiment of this invention.

FIG. 5 is a cross sectional view of a semiconductor package structure 5 according to the fourth embodiment of this invention. The semiconductor package structure 5 comprises a substrate unit 500, a first chip stack structure 511, sealing layers 521, and bonding wires 540. The substrate unit 500 has a chip mounting area 502 defined thereupon and a circuit structure formed thereon. The circuit structure has a plurality of pads 503. The first chip stack structure 511 comprises a first chip 511a and a second chip 511b, which have different sizes and different functions from each other. Moreover, the first chip 511a and the second chip 511b may have the same size with the same function where the bonding wire 540 may be buried under the sealing layer 521. In particular, the sealing layer 521 is a FOW (Film-On-Wire) film. Each of the first chip 511a and the second chip 511b has an upper surface, a bottom surface opposite the upper surface, and a plurality of through silicon plugs 507 disposed therein to form electrical interconnections between the upper surface and the bottom surface. Moreover, the first chip 511a has a plurality of bonding pads 511c formed on the upper surface thereof. The most prominent difference from the third embodiment is that the first chip stack structure 511 can be electrically connected to the substrate unit 500 by both the interconnections of the through silicon plugs 507 and wire bonding. To be more specific, the first chip stack structure 511 is electrically connected to the substrate unit 500 by bonding wires 540 connecting the bonding pads 511c of the first chip 511a to the pads 503 of substrate unit 500. In other aspects, people skill in this field may proceed with electrically connecting the first chip stack structure 511 and the substrate unit 500 by bonding wires 540 between the other chip of the first chip stack structure 511 and the pads 503 of substrate unit 500. The detail description of the primary elements and the materials of the sealing layers 521, the through silicon plugs 507 and the substrate unit 500 are depicted in the first embodiment and the related descriptions are omitted here. Testing of the electrical interconnection integrity of the through silicon plugs 507 between the first chip 511a and the second chip 511b and between the first chip 511a and the substrate unit 500 is depicted in the first embodiment and related descriptions are omitted here.

Figure 6:
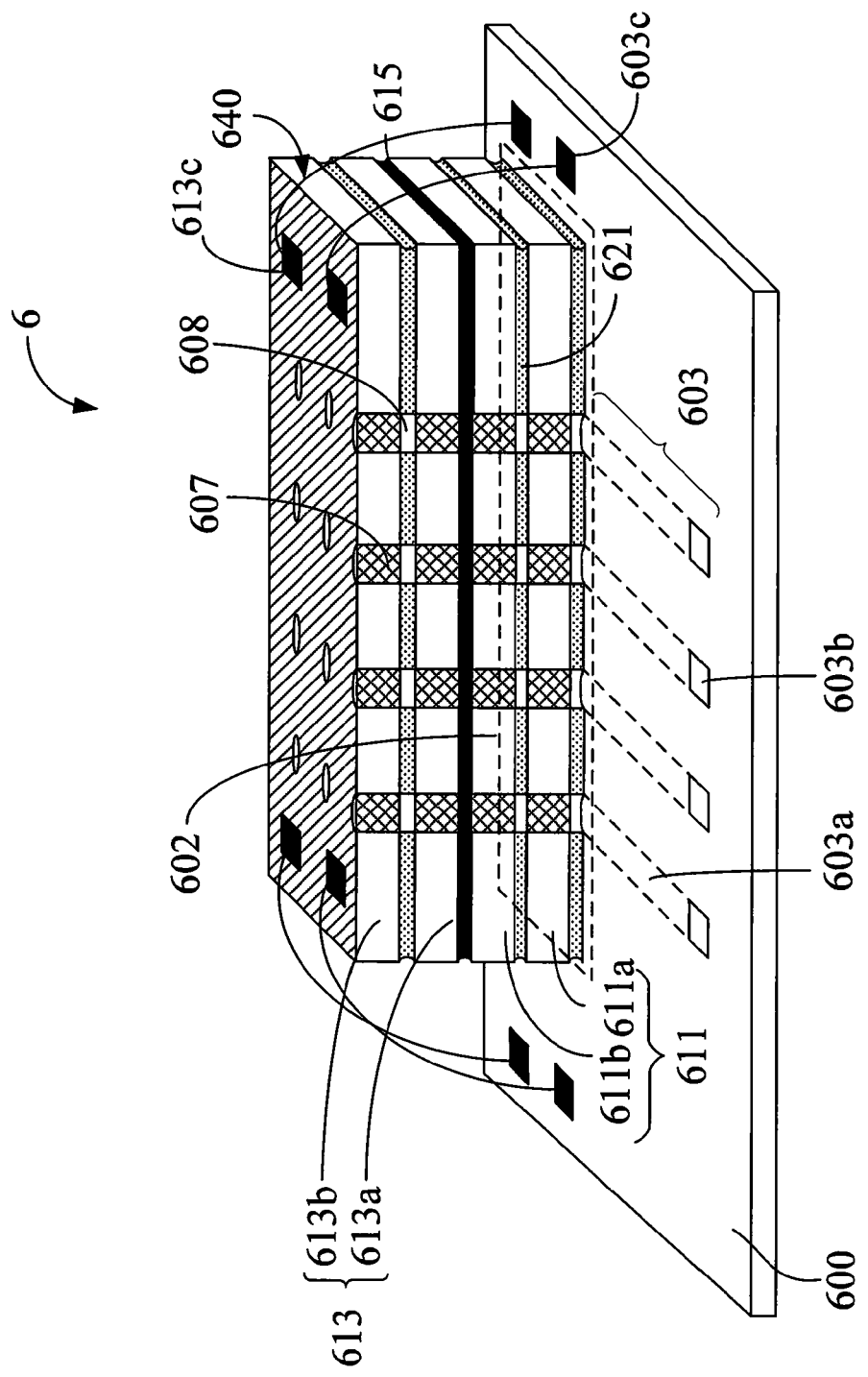
FIG. 6 is a partial cross sectional view of a semiconductor package structure according to the fifth embodiment of this invention.

FIG. 6 is a partial cross sectional view of a semiconductor package structure 6 according to the fifth embodiment of this invention. The semiconductor package structure 6 comprises a substrate unit 600, a first chip stack structure 611, a second chip stack structure 613, an insulating adhesive layer 615, sealing layers 621, and bonding wires 640. The substrate unit 600 has a chip mounting area 602 defined thereupon and a circuit structure 603 formed thereon. The circuit structure 603 has a plurality of connecting circuits 603a, a plurality of test pads 603b, and a plurality of first bonding pads (not shown), and a plurality of second bonding pads 603c. Each of the first bonding pads (not shown) is arranged within the chip mounting area 602, and each of the test pads 603b is arranged outside of the chip mounting area 602. The connecting circuits 603a connect the first bonding pads (not shown) and the test pads 603b, and the connecting circuits 603a are covered with an isolating protection layer (not shown) formed on the substrate unit 600, which may be a solder mask.

The first chip stack structure 611 comprises a plurality of chips 611a and 611b. Each of the chips 611a and 611b has an upper surface, a bottom surface opposite the upper surface, and a plurality of through silicon plugs 607 disposed therein to form electrical interconnections between the upper surface and the bottom surface. Each of the through silicon plugs 607 comprises a bottom electrode 608 jutting out from the bottom surfaces of the chips 611a and 611b. Through the bottom electrodes 608 of the through silicon plugs 607 disposed therein, the adjacent chips 611a and 611b are electrically connected. The second chip stack structure 613 comprises a plurality of chips 613a and 613b, each of which has an upper surface, a bottom surface opposite the upper surface, and a plurality of through silicon plugs 607 disposed therein to form electrical interconnections between the upper surface and the bottom surface. Each of the through silicon plugs 607 comprises a bottom electrode 608 jutting out from the bottom surfaces of the chips 613a and 613b. Through the bottom electrodes 608 of the through silicon plugs 607 disposed therein, the adjacent chips 613a and 613b are electrically connected.

The most prominent difference from the first embodiment is that the semiconductor package structure 6 further comprises the second chip stack structure 613 attached to but insulated from the first chip stack structure 611 by the insulating adhesive layer 615. Through the electrical isolation of the insulating adhesive layer 615, the first chip stack structure 611 and the second chip stack structure 613 may perform different functions respectively. Similarly, the first chip stack structure 611 is mounted on the chip mounting area 602 of the substrate unit 600, and the through silicon plugs 607 of the first chip stack structure 611 are electrically connected to the first bonding pads (not shown) within the chip mounting area 602 which connect to the test pads 603b through the connecting circuits 603a respectively. The second chip stack structure 613 is electrically connected to the substrate unit 600 by wire bonding. In particular, the chip 613b has a plurality of third bonding pads 613c formed on the upper surface thereof, and the second chip stack structure 613 is electrically connected to the substrate unit 600 with the bonding wires 640 between the second bonding pads 603c of the substrate unit 600 to the third bonding pads 613c of the chip 613b. The detail description of the primary elements and the materials of the sealing layers 621, the through silicon plugs 607, the bottom electrode 608, and the substrate unit 600 are depicted in the first embodiment and the related descriptions are omitted here. Testing of the electrical interconnection integrity of the through silicon plugs 607 between the chips 611a and 611b, between the chips 613a and 613b, between the first chip stack structure 611 and the substrate unit 600 and between the second chip stack structure 611 and the substrate unit 600 is depicted in the first embodiment and related descriptions are omitted here.

Figure 7:
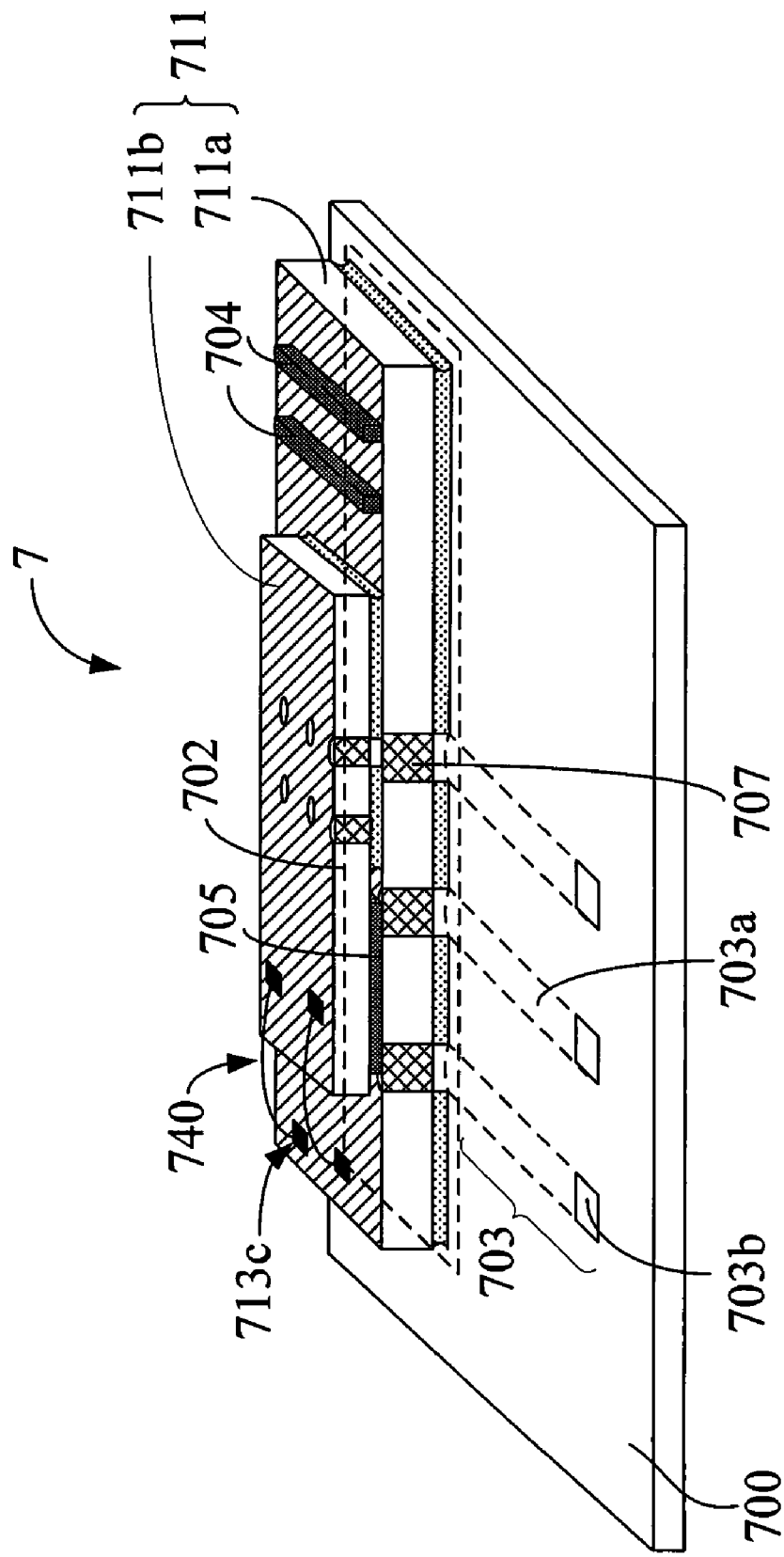
FIG. 7 is a partial cross sectional view of a semiconductor package structure according to the sixth embodiment of this invention.

FIG. 7 is a partial cross sectional view of a semiconductor package structure 7 according to the sixth embodiment of this invention. The semiconductor package structure 7 comprises a substrate unit 700, a first chip stack structure 711, a plurality of passive components 704, a spacer 705, and a plurality of bonding wires 740. The substrate unit 700 has a chip mounting area 702 defined thereupon and a circuit structure 703 formed thereon. The circuit structure 703 has a plurality of connecting circuits 703a, a plurality of test pads 703b, and a plurality of first bonding pads (not shown). The first chip stack structure 711 comprises a first chip 711a and a second chip 711b, which have different sizes and different functions from each other. Each of the first chip 711a and the second chip 711b has an upper surface, a bottom surface opposite to the upper surface, and a plurality of through silicon plugs 707 disposed therein to form electrical interconnections between the upper surface and the bottom surface.

The most prominent difference from the fourth embodiment is that this embodiment comprises a plurality of passive components 704, and the spacer 705. The passive components 704 are formed on and electrically connected to the first chip 711a to implement the circuit functions together with the first chip 711a. The second chip 711b comprises a plurality of through silicon plugs 707 for electrical interconnections with only a portion of the through silicon plugs 707 of the first chip 711a in one area. To remain a consistent space between the two chips 711a, 711b and to prevent the second chip 711b from tilt, the spacer 705 is formed on the first chip 711a at the area without electrical interconnections of the through silicon plugs 707 between the two chips 711a, 711b, wherein a portion of the second chip 711b is in turn disposed on the spacer 705. In other words, the spacer 705 is disposed between the two adjacent chips 711a, 711b. Moreover, in this embodiment, both the first chip 711a and the second chip 711b have a plurality of second bonding pads 713c formed on the upper surface thereof; hence, the first chip 711a and the second chip 711b can also be electrically connected via the bonding wires 740 connecting the bonding pads 713c of the first chip 711a to the bonding pads 713c of the second chip 711b. The detail description of the primary elements and the materials of the through silicon plugs 707, and the substrate unit 700 are depicted in the first embodiment and the related descriptions are omitted here. In other embodiments, the passive components 704 may be formed on the substrate unit 700. Testing of the electrical interconnection integrity of the through silicon plugs 707 between the chip 711a and the substrate unit 700 and between the two chips 711a, 711b is depicted in the first embodiment and related descriptions are omitted here.

FIGS. 8a-8f are process drawings illustrating a method for manufacturing a semiconductor package structure of this invention. In reference to FIG. 8a, a substrate comprises a plurality of substrate units 801, and each of the substrate units 801 comprises a chip mounting area 802 defined thereupon and a circuit structure 803 formed thereon. The substrate unit 801 is disposed on a stage 800. The circuit structure 803 has a plurality of connecting circuits 803a, a plurality of test pads 803b, and a plurality of bonding pads 803c. Each of the bonding pads 803c is arranged within the chip mounting area 802, and each of the test pads 803b is arranged outside of the chip mounting area 802. The connecting circuits 803a connect the bonding pads 803c and the test pads 803b, and the connecting circuits 803a are covered with an isolating protection layer formed on the substrate unit 801. In more detail, the isolating protection layer covering the connecting circuits 803a of the circuit structure 803 is a solder mask. The substrate unit 801 is heated to a first temperature by the stage 800, and a chip mounting area 802 is defined on an upper surface 801a of the substrate unit 801. Afterwards, a sealing material is applied onto the chip mounting area 802 by a syringe 811 to form a first sealing layer 821a. Other methods for sealing material application including screen printing, coating, stencil printing, spin coating, and film attaching can also be used. In this embodiment, the first temperature may be around 80 degrees Celsius.

Figure 8A:
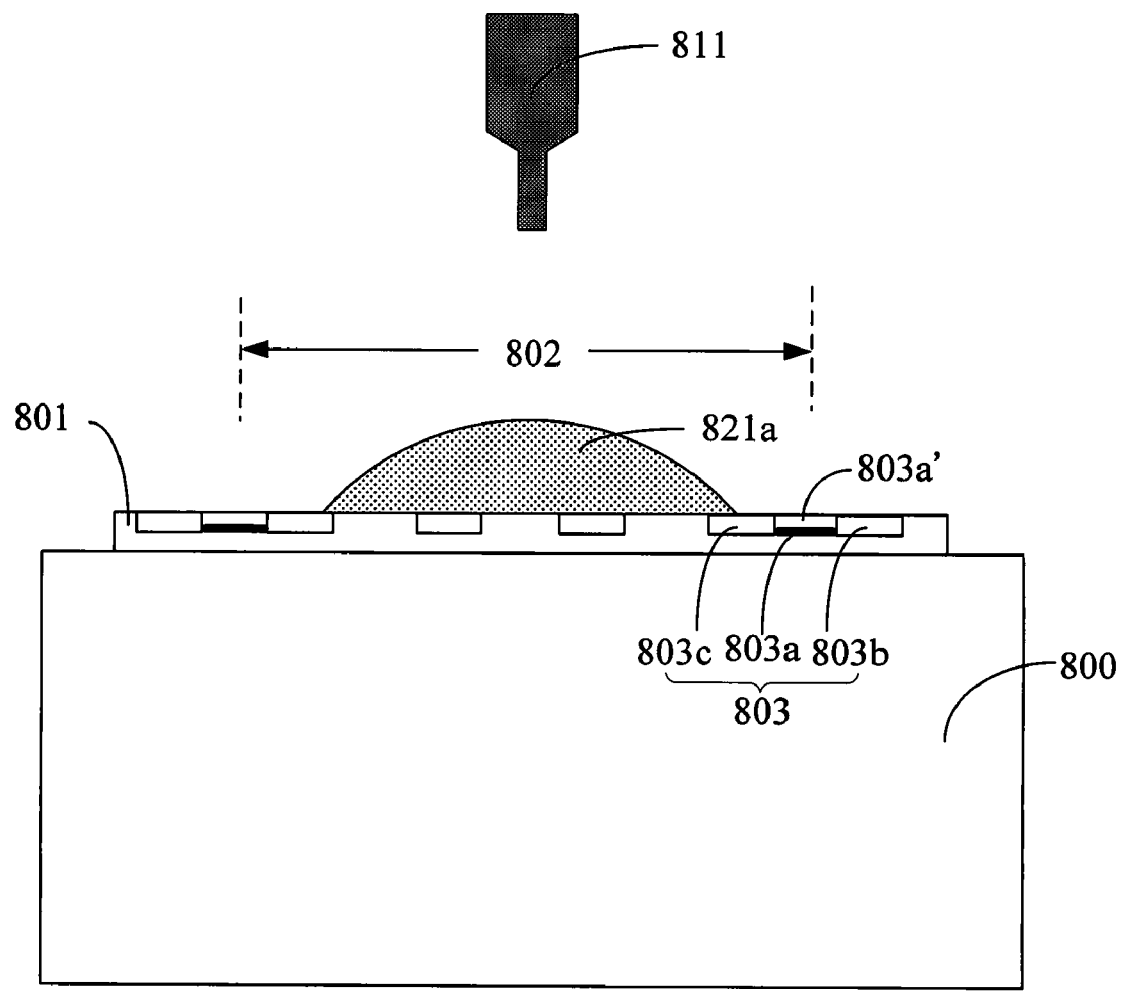
FIGS. 8a-8f are process drawings illustrating a method for manufacturing a semiconductor package structure of this invention.
Figure 8B:
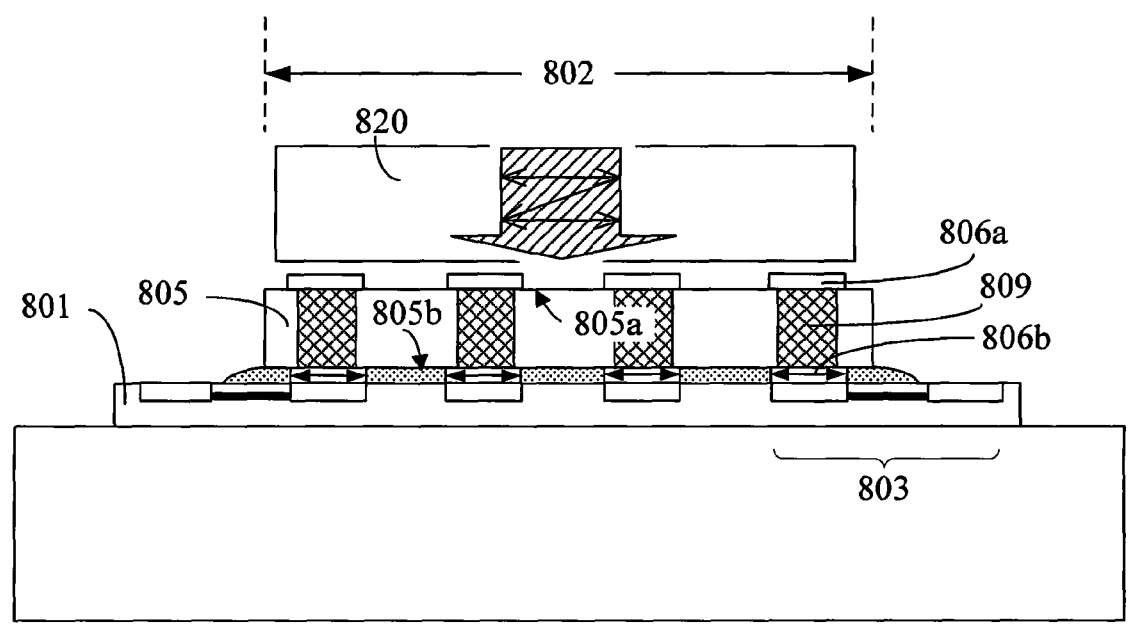

Next, in reference to FIG. 8b, a first chip 805 is attached on the chip mounting area 802 by the first sealing layer 821a. The first chip 805 has a first upper surface 805a, a first bottom surface 805b and a plurality of through silicon plugs 809 disposed therein to form electrical interconnections between the first upper surface 805a and the first bottom surface 805b. A plurality of upper electrodes 806a and bottom electrodes 806b are respectively formed on the first upper surface 805a and the first bottom surface 805b of the first chip 805 aligned with the through silicon plugs 809; in other words, the first chip 805 is similar to the chip 201 recited above and shown in FIG. 2. At least a portion of the through silicon plugs 809 of the first chip 805 are electrically connected to the substrate unit 801 by bonding the bottom electrodes 806b to the bonding pads 803c of the substrate unit 801. Meanwhile, the sealing material then fills the space between a portion of the substrate unit 801 and the bottom surface 805b of the first chip 805 to form a first sealing layer 821a.

Figure 8C:
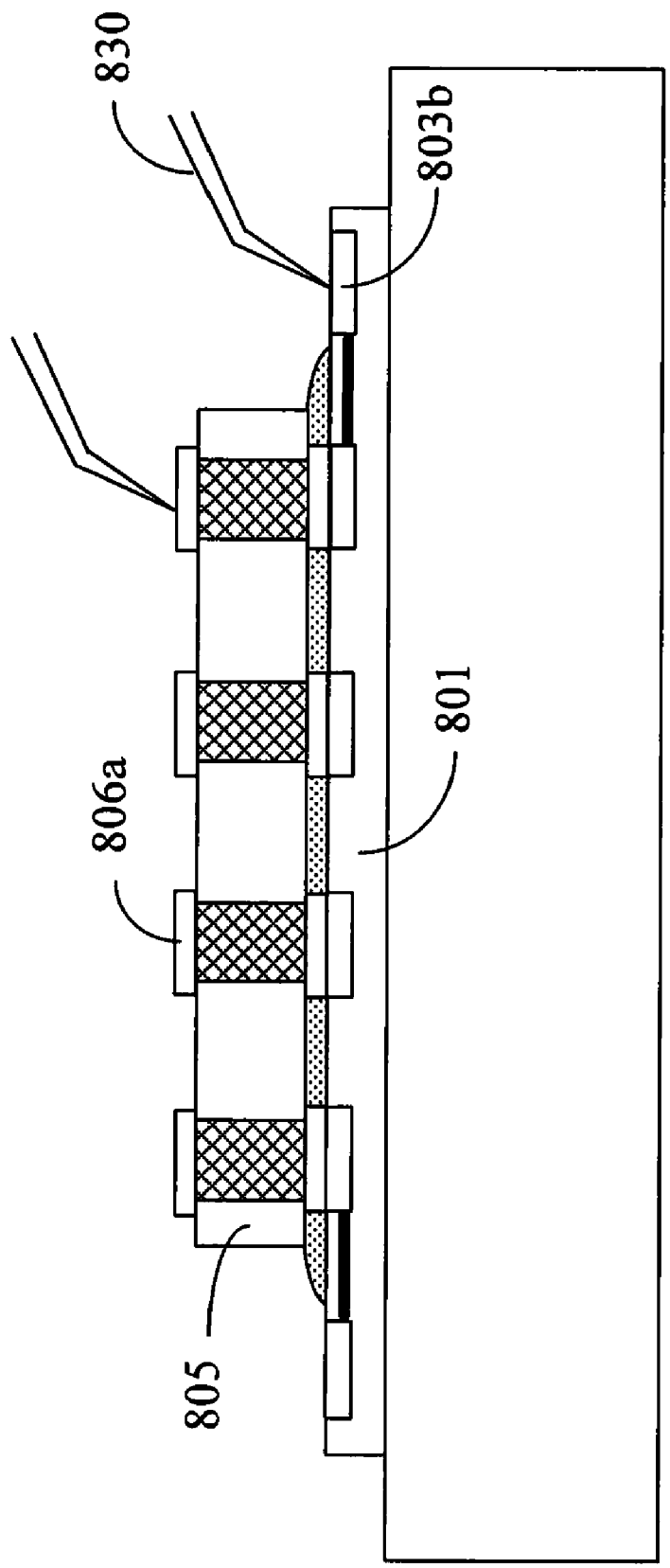

Furthermore, for the secure attachment of the bottom electrodes 806b to the bonding pads 803c to maintain good electrical interconnections, an ultrasonic wave is applied to bonding the aforesaid structure as follows. After the first chip 805 is disposed on the chip mounting area 802, a bonding tool 820 presses the first chip 805 at a second temperature with ultrasonic waves to securely bond the bottom electrodes 806b to the bonding pads 803c. In this embodiment, the second temperature may be kept at around 200 degrees Celsius. Then, ultrasonic waves are applied to vibrate the bonding interfaces between the bottom electrodes 806b and the bonding pads 803c to induce metal atom diffusion on the bonding interfaces. The aforementioned secure bonding between the electrodes of the chip and the substrate unit can also be executed by means of thermo-compressing, thermo-sonic bonding, ultrasonic bonding, or a combination thereof. After the bonding process, the first chip 805 can be tested by probes 830 followed by a redundancy repairing step if required to increase the yield of semiconductor package structures, as shown in FIG. 8c. In more details, the probes 830 contact the test pads 803b of the substrate unit 801 and the corresponding upper electrodes 806a of the first chip 805 to detect the electrical interconnection integrity of the first chip 805 and the substrate unit 801.

Figure 8D:
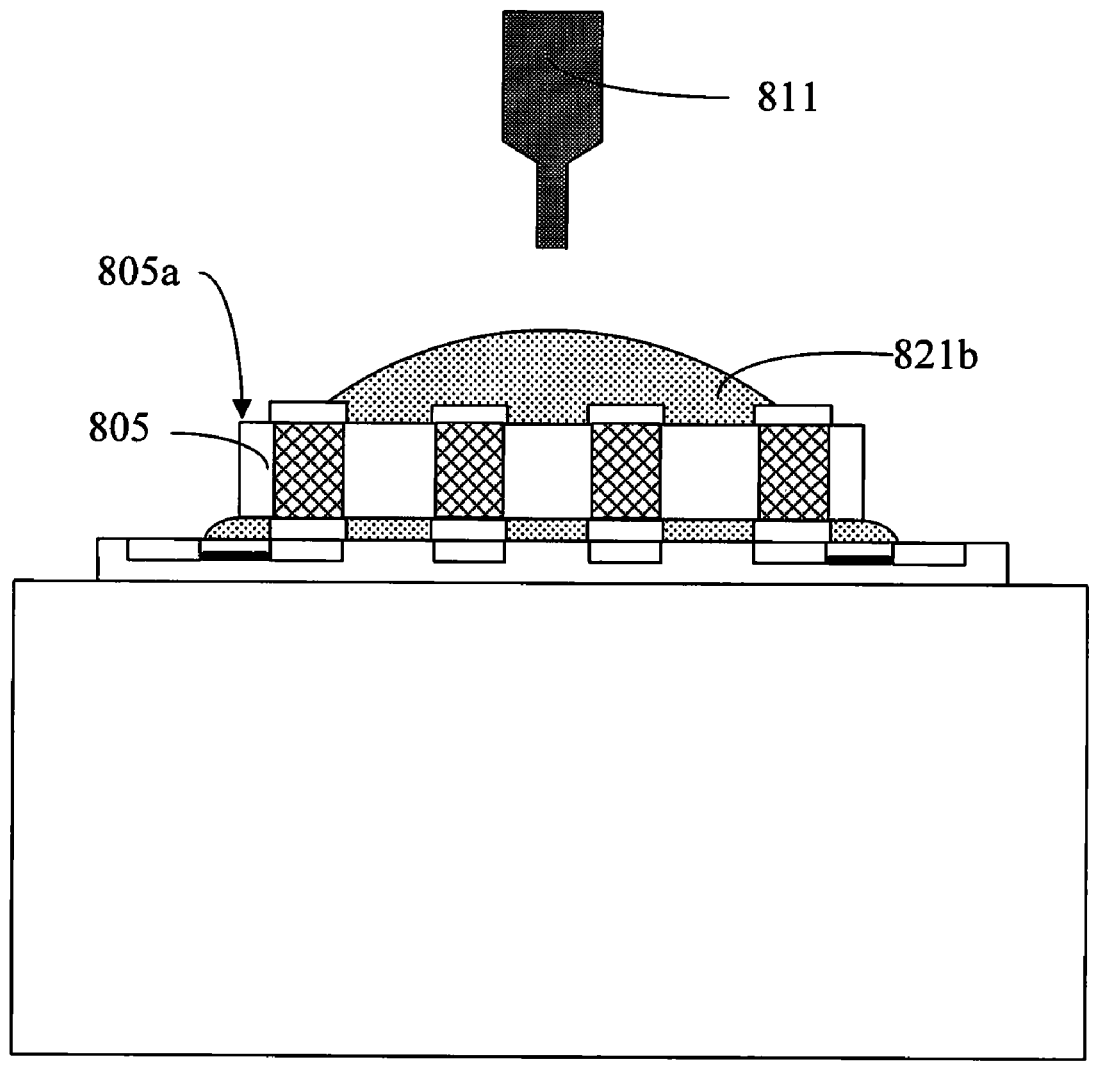

Next, in reference to FIG. 8d, a sealing material is applied by the syringe 811 onto first upper surface 805a to form a second sealing layer 821b.

Figure 8E:
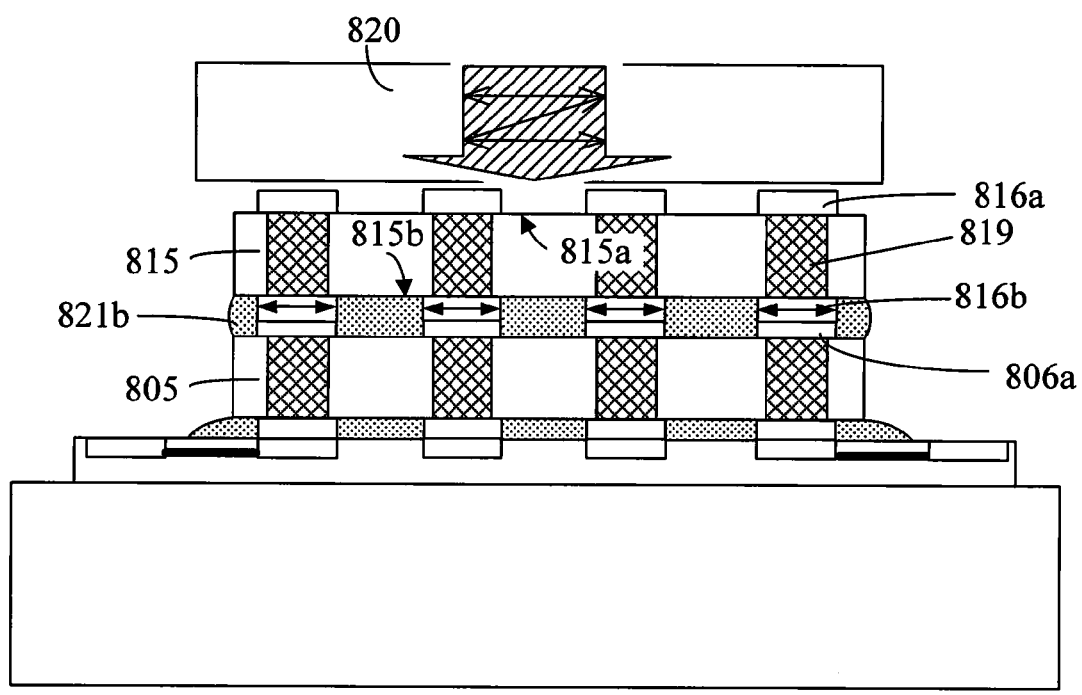

Next, in FIG. 8e, a second chip 815 is attached on the first upper surface 805a by the second sealing layer 821b. The second chip 815 has a second upper surface 815a, a second bottom surface 815b and a plurality of through silicon plugs 819 disposed therein to form electrical interconnections between the second upper surface 815a and the second bottom surface 815b. At least a portion of the through silicon plugs 819 of the second chip 815 are electrically connected to the upper electrodes 806a of the first chip 805. A plurality of upper electrodes 816a and bottom electrodes 816b are formed respectively on the second upper surface 815a and the second bottom surface 815b of the second 815 chip aligned with the through silicon plugs 819. In this embodiment, the bottom electrodes 816b of the second chip 815 are bond to the upper electrodes 806a of the first chip 805. Meanwhile, the second sealing layer 821b then fills the space between the first chip 805 and the second chip 815 enclosing the electrodes 806a, 816b to protect the electrical interconnects from environmental interference.

As described above for FIG. 8b, bonding of the bottom electrodes 816b and the upper electrodes 806a is executed with the bonding tool 820 pressing the second chip 815 to the first chip 805 at the second temperature with ultrasonic waves. In this embodiment, the second temperature may also be kept at around 200 degrees Celsius. As a result, the electrical connection of the two stacked chips 805 and 815 can be implemented at lower pressure, lower temperature and in shorter operation time compared to the conventional process.

Figure 8F:
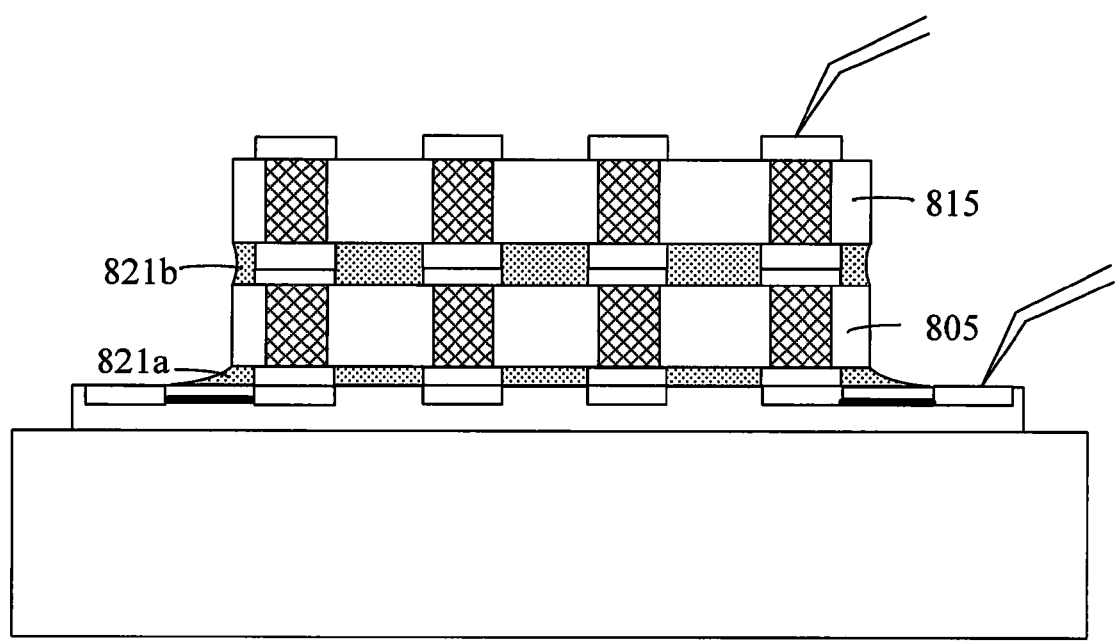

Finally, in reference to FIG. 8f, the completed semiconductor package structure is tested with testing probes to verify the electrical interconnection integrity of the second chip 815 followed by a redundancy repairing step if required to increase the yield of semiconductor package structures, as described in FIG. 8c.

The processes described above in FIGS. 8a-8f can be used in the first to sixth embodiments described above to electrically connecting multiple chips with the through silicon plug structures.

Figure 12:
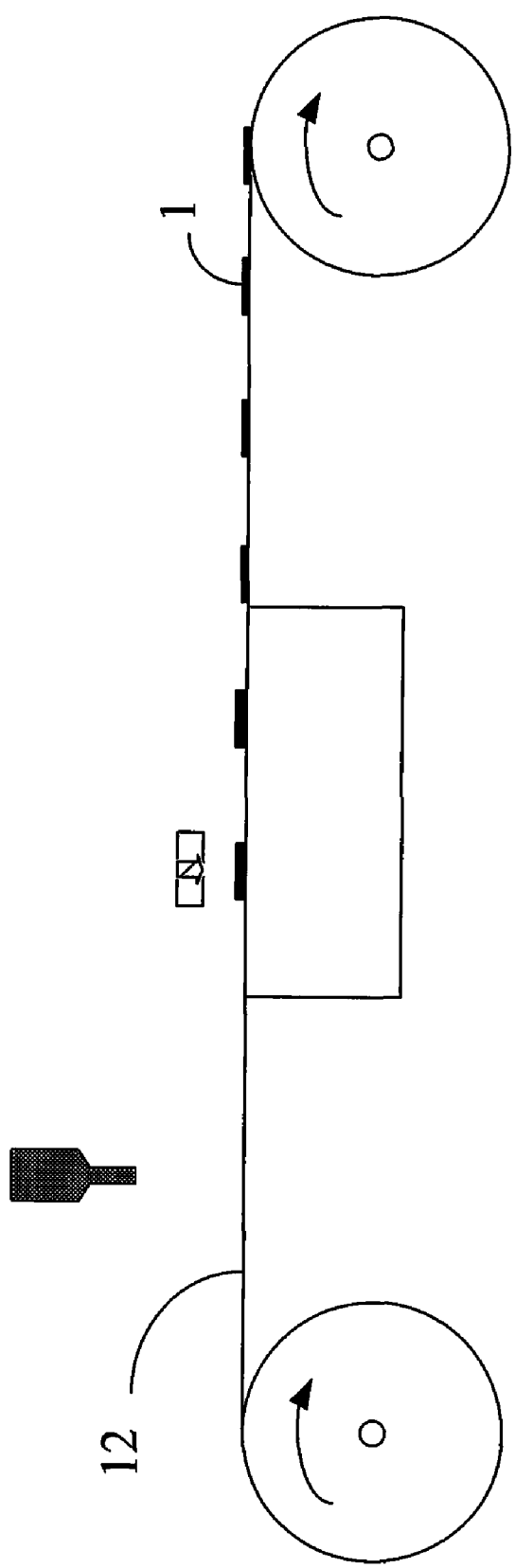
FIG. 12 is a schematic view of reel-to-reel transportation of the substrate units of the semiconductor package structure of this invention.

The semiconductor package structure of this invention can be manufactured in mass production, which is briefed as follows. Taking the first embodiment as an example and referring to FIG. 1 and FIG. 12, the semiconductor package structure 1 may be massively produced by reel-to-reel transportation of the substrate units. For example, with the flexible membrane as the film substrate 12 such as a bundle of polyimide film, the successive substrate units 100 of the film substrate 12 are continuously transported to the bonding position by rolling the two ends of the film substrate 12 so that each of the chip stack structure 111 can sequentially be bonded to the substrate unit 100. In other applications, the reel-to-reel transportation may be replaced by strip-to-strip transporting or panel-to-panel transporting. In more details, a plurality of substrate strips comprising a plurality of substrate units are continuously transported to the position for process. So does the substrate panels.

For this embodiment, the chip stack structure 111 can be formed through the following steps. First, the film substrate 12 is rolled to have a particular the substrate unit 100 located at in a bonding position and then kept stationary for bonding process. Then, the chip 111a is bonded to the substrate unit 100 of the film substrate 12 by connecting the through silicon plugs 107 to the bonding pads of the substrate unit 100. The chips 111b, 111c and 111d are then successively stacked up with the interconnections of the through silicon plugs 107. Once bonding of all the chips 111a, 111b, 111c and 111d is finished, the film substrate 12 is rotated to perform similar steps on the next substrate unit to form another semiconductor package structure, and the processes are repeated until a plurality of chip stack structures 111 are formed on all the substrate units 100 of the film substrate 12.

The first chip stack structure 111 may also be formed in different ways. First, a plurality of chips 111a are successively bonded on all the substrate units 110 of the film substrate 12. After the entire bundle of film substrate 12 is completed with the attachment of the chips 111a, the plurality of the chips 111b are then bonded on the corresponding chips 111a. Similarly, the attachment of the chips 111c is implemented after all the chips 111b are attached for the entire film substrate 12. So as the attachment of the chips 111d.

In other aspects of the present invention, the semiconductor package structure comprises a first semiconductor element, a second semiconductor element, and a substrate. The first semiconductor element and the second semiconductor element are one of a chip or a wafer comprising a plurality of chips. The following two embodiments are addressed to illustrate semiconductor elements adopting the chip or the wafer.

Figure 9:
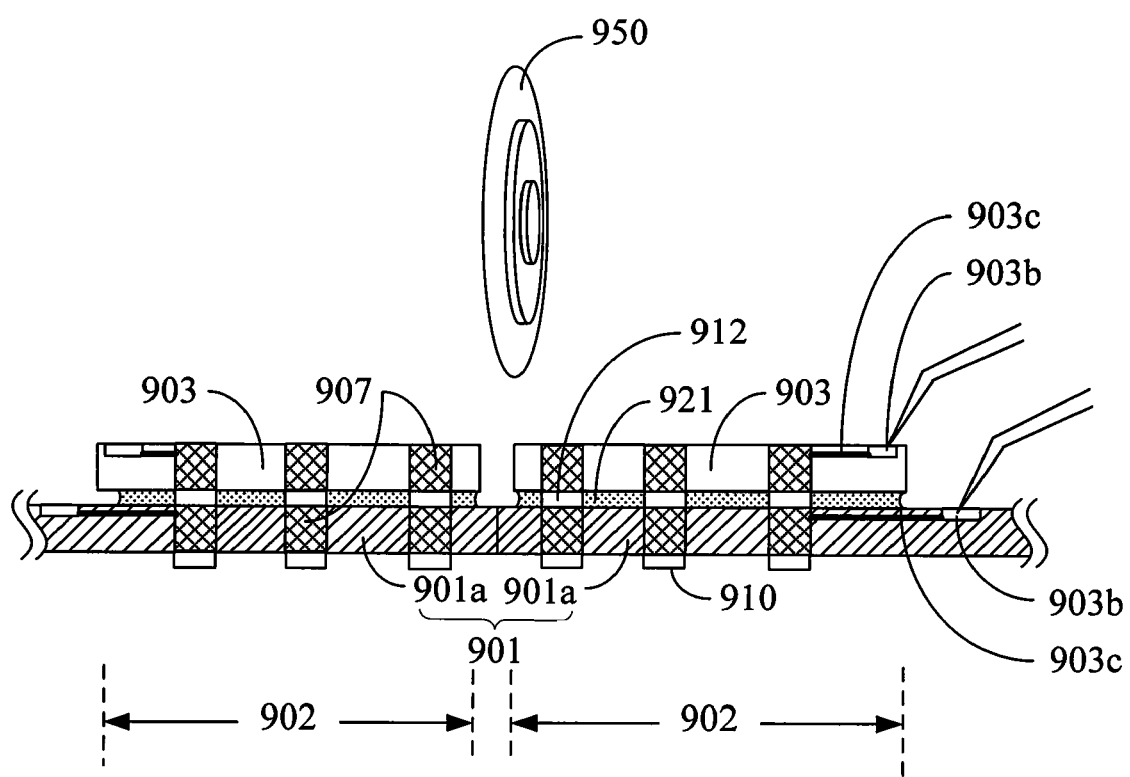
FIG. 9 is a cross sectional view of a semiconductor package structure according to the seventh embodiment of this invention.

FIG. 9 is a cross sectional view of the seventh embodiment of this invention. It shows a plurality of individual chips bonded to a wafer comprising a plurality chips before singulating into individual semiconductor packages for forming a plurality of semiconductor package structures. Before singulating process, a wafer 901 (i.e. the first semiconductor element) that comprises a plurality of first semiconductor chips 901a is provided, and a plurality of second semiconductor chips 903 (i.e. the second semiconductor elements) are mounted on the corresponding first semiconductor chips 901a. Each of the plurality of first semiconductor chips 901a of the wafer 901 has a first upper surface and a first bottom surface opposite to the first upper surface, a plurality of test pads 903b, a plurality of connecting circuits 903c, a first chip mounting area 902 defined on the first upper surface and a plurality of through silicon plugs 907 disposed therein to form electrical interconnections between the first upper surface and the first bottom surface. Each of the through silicon plugs 907 comprises a first electrode 910 jutting out from the first bottom surface, each of the test pads 903b is arranged outside of the first chip mounting area 902 and connected to each of the through silicon plugs through the connecting circuit 903c. The second semiconductor chips 903 has a second upper surface and a second bottom surface opposite to the second upper surface, a plurality of test pads 903b, a plurality of connecting circuits 903c, a second chip mounting area (not shown) defined on the second upper surface and a plurality of through silicon plugs 907 disposed therein to form electrical interconnections between the second upper surface and the second bottom surface. Each of the through silicon plugs 907 comprises a second electrode 912 jutting out from the second bottom surface, and each of the test pads 903b is arranged outside of the second chip mounting area (not shown) and connected to each of the through silicon plugs 907 through the connecting circuit 903c. As shown in FIG. 9, the connecting circuits 903c are covered with an isolating protection layer (not shown) formed on the upper surface of semiconductor chips 901a, 903. In more detail, the isolating protection layer formed on the upper surface of semiconductor chips 901a, 903 covering the connecting circuits 903c is a passivation layer.

First sealing layers 921 are formed on the first chip mounting areas 902 of the first semiconductor chips 901a of the wafer 901, and the second semiconductor chips 903 are attached on the first chip mounting areas 902 correspondingly by the first sealing layers 921. In other words, spaces between the first semiconductor chips 901a and the second semiconductor chips 903 are filled by the first sealing layers 921. The through silicon plugs 907 disposed in the second semiconductor chips 903 are electrically connected to the through silicon plugs 907 disposed in the corresponding first semiconductor chips 901a through the second electrodes 912. The electrical connection may be achieved by thermo-compressing, thermo-sonic bonding, ultrasonic bonding or a combination thereof as illustrated in aforementioned embodiments and thus is omitted here. From FIG. 9, the stack relationship between the first semiconductor chip 901a and the second semiconductor chip 903 can be understood more clearly.

With the test pads 903b arranged outside of the first chip mounting area 902, a test signal can be applied to the test pads 903b for evaluating the electrical interconnection between the first semiconductor chip 901a of the wafer 901 (i.e. the first semiconductor element) and second semiconductor chips 903 (i.e. the second semiconductor element). In this embodiment, with the entire wafer 901 for stacking, a plurality of second semiconductor chips 903 can be sequentially bonded to the correspondingly first semiconductor chips 901a in the same process to form a plurality of chip stack structures with two semiconductor chips 901a, 903. Testing of the electrical interconnection integrity for the plurality of the two-chip stack structures can further be performed. After assuring the electrical interconnections of the two-chip stack structures, the wafer 901 is singulated into a plurality of individual two-chip stack structures by a saw 950. Other singulation means such as punching, routing can also be used. A plurality of individual two-chip stack structures can further be stacked to form a multi-chip stack structure by using the manufacturing method described in the above embodiments. In this embodiment, the electrical interconnection integrity of every two-chip stack structure is verified before the stacking of several two-chip stack structures. As a result, unnecessary waste of manufacturing costs and time can be avoided. The overall packaging yield of subsequent manufacturing processes can be greatly improved. The seventh embodiment is applicable to Chip-on-Wafer (CoW) process where more of the second semiconductor chips 903 can be vertically stacked on the first semiconductor chip 901a of the wafer 901.

Moreover, the semiconductor package structure having this kind of chip stack structure can further be mounted on a substrate unit. A second sealing layer is formed on the substrate unit. Then, one of the chip stack structures is mounted on the substrate unit by the second sealing layer. The through silicon plugs 907 of the first semiconductor chip 901a is electrically connected to the substrate unit through the first electrodes 910. In other words, a space between the chip stack structure and the substrate unit is filled by the second sealing layer.

Figure 10:
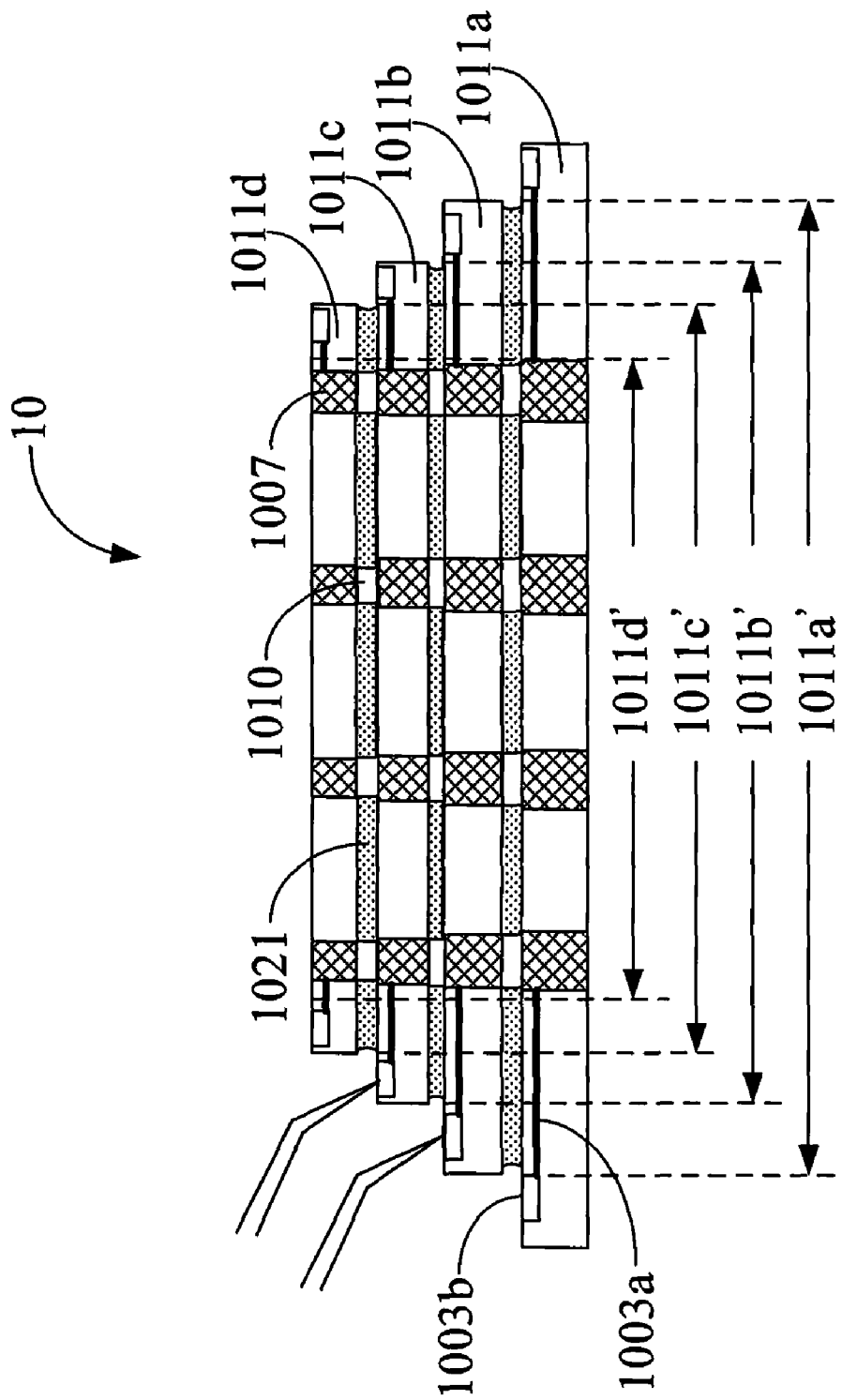
FIG. 10 is a cross sectional view of a chip stack structure of the seventh embodiment of this invention.
Figure 11:
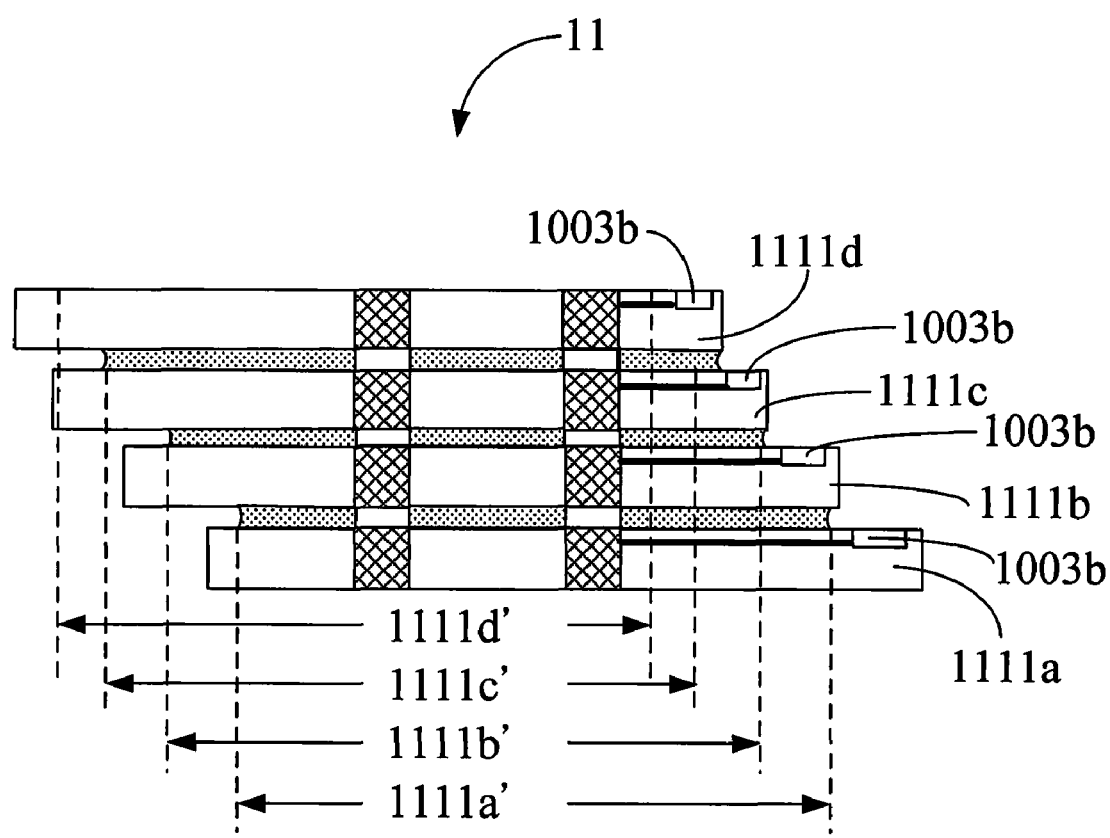
FIG. 11 is a cross sectional view of another chip stack structure of the seventh embodiment of this invention.

Two aspects of the individual chip stack structures are shown in FIG. 10 and FIG. 11. In FIG. 10, the chip stack structure 10 comprises a plurality of semiconductor chips 1011a, 1011b, 1011c and 1011d. Each of the semiconductor chips 1011a, 1011b, 1011c and 1011d has an upper surface, a bottom surface opposite the upper surface, a plurality of test pads 1003b, a plurality of connecting circuits 1003a, a chip mounting area 1011a', 1011b', 1011c' and 1011d' defined on the first upper surface, and a plurality of through silicon plugs 1007 disposed therein to form electrical interconnections between the upper surface and the bottom surface, and sealing layers 1021. Each of the test pads 1003b is arranged outside of the corresponding chip mounting area 1011a', 1011b', 1011c' or 1011d'. The connecting circuits 1003a connect the test pads 1003b and the corresponding through silicon plugs 1007, and the connecting circuits 1003a are covered with an isolating protection layer formed on the semiconductor chips 1011a, 1011b, 1011c and 1011d. In more detail, the isolating protection layer in this embodiment is a passivation layer.

The semiconductor chips 1011a, 1011b, 1011c and 1011d are mounted on the chip mounting area 1011a', 1011b', 1011c' and 1011d' of the corresponding adjacent semiconductor chip below. More specifically, the semiconductor chips 1011a, 1011b, 1011c and 1011d have different size, and the stack structure is in a trapezoid shape. Each of the through silicon plugs 1007 except for the through silicon plug 1007 of the semiconductor chips 1011d comprises an upper electrode 1010 jutting out from the upper surface, and the plurality of through silicon plugs 1007 of two adjacent semiconductor chips are electrically connected through the upper electrodes 1010 respectively.

As can be seen from FIG. 10, the through silicon plugs 1007 of each of the plurality of semiconductor chips 1011a, 1011b, 1011c and 1011d are electrically connected to the through silicon plugs 1007 of an adjacent semiconductor chip respectively.

To test the electrical interconnection integrity between the semiconductor chips, as shown in FIG. 10, two probes or testing pins contact the corresponding test pads 1003b of any two stacked semiconductor chips. Detailed description of testing is depicted in the first embodiment and omitted here.

People skilled in this field may proceed with the chips having the same size as shown in FIG. 11. In FIG. 11, the chip stack structure 11 comprises a plurality of semiconductor chips 1111a, 1111b, 1111c and 1111d, and all semiconductor chips 1111a, 1111b, 1111c and 1111d have the same size and the chip mounting area 1011a', 1011b', 1011c' and 1011d' defined thereupon. Each of the semiconductor chips 1111a, 1111b, 1111c and 1111d is mounted on the chip mounting area 1011a', 1011b', 1011c' and 1011d' of the semiconductor chip below, and the chip stack structure 11 is formed in a stair shape. As shown in FIG. 11, the test pads 1003b of each of the semiconductor chips 1111a, 1111b, 1111c and 1111d are arranged outside of the chip mounting area 1011a', 1011b', 1011c' and 1011d'; in other words, the test pads 1003b are uncovered for contact of the testing pins.

People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A semiconductor package structure, comprising:
a substrate unit comprising a circuit structure formed thereon and a chip mounting area defined thereupon, the circuit structure having a plurality of bonding pads and a plurality of test pads, each of the bonding pads being arranged within the chip mounting area and connected to each of the test pads; and
a first chip stack structure, comprising a plurality of chips, each of the chips having an upper surface, a bottom surface opposite to the upper surface, and a plurality of through silicon plugs disposed therein to form electrical interconnections between the upper surface and the bottom surface, each of the through silicon plugs comprising a first electrode jutting out from one of the upper surface or the bottom surface, and the plurality of through silicon plugs of two adjacent chips being electrically connected through the first electrodes respectively;
wherein the first chip stack structure is mounted on the chip mounting area of the substrate unit and at least a portion of the through silicon plugs are electrically connected to the bonding pads, and the plurality of test pads are arranged outside of the chip mounting area.

2. The semiconductor package structure as claimed in claim 1, wherein the first chip stack structure is electrically connected to the substrate unit by wire bonding.

3. The semiconductor package structure as claimed in claim 1, wherein the circuit structure further comprises a plurality of connecting circuits for connecting the bonding pads and the test pads.

4. The semiconductor package structure as claimed in claim 3, wherein the connecting circuits are covered with an isolating protection layer.

5. The semiconductor package structure as claimed in claim 1, further comprising a sealing layer being formed between two adjacent chips and between the first chip stack structure and the substrate unit for filling spaces therebetween.

6. The semiconductor package structure as claimed in claim 5, wherein the sealing layer is made of a material selected from the following group: non-conductive paste (NCP), non-conductive film (NCF), anisotropic conductive paste (ACP), anisotropic conductive film (ACF), underfill, non-flow underfill, B-stage gel, molding compound, film-on-wire (FOW), and a combination thereof.

7. The semiconductor package structure as claimed in claim 1, wherein the through silicon plugs are made of a material selected from the following group: Cu, Au, Ag, Sn, Sn/Pb, Sn/Ag alloy, Sn/Ag/Cu alloy, lead-free solder, Ni/Au alloy, Ni/Pd alloy, Ni/Pd/Au alloy, W, poly Si, doped Si, conductive polymer and a combination thereof.

8. The semiconductor package structure as claimed in claim 1, wherein the substrate unit is selected from the following group: an organic substrate, a ceramic substrate, a glass epoxy substrate, a FR-4 substrate, a FR-5 substrate, a fiber-reinforced substrate and a bismaleimide triazine (BT) substrate.

9. The semiconductor package structure as claimed in claim 1, wherein the substrate unit is a flexible membrane selected from the following group: a polyimide film and a Polyethylene terephthalate (PET) film.

10. The semiconductor package structure as claimed in claim 1, wherein each of the plurality of through silicon plugs further comprises a second electrode jutting out from the other of the upper surface or the bottom surface of the chip, in which the plurality of through silicon plugs of two adjacent chips are electrically connected through interconnections of the first electrodes and the second electrodes.

11. The semiconductor package structure as claimed in claim 10, wherein the first electrodes and the second electrodes of two adjacent chips are electrically connected by thermo-compressing, thermo-sonic bonding, ultrasonic bonding, or a combination thereof.

12. The semiconductor package structure as claimed in claim 10, wherein the first electrodes and the second electrodes are portions of the through silicon plugs.

13. The semiconductor package structure as claimed in claim 10, wherein the first electrodes and the second electrodes are plated bumps, electroless plated bumps, stud bumps, conductive polymer bumps, or metal composite bumps made of a material selected from the group of: Cu, Au, Ag, In, Ni/Au, Ni/Pd/Au, Cu/Ni/Au, Cu/Au, Al and a combination thereof.

14. The semiconductor package structure as claimed in claim 1, wherein the first chip stack structure comprises a first chip, a second chip and a third chip, and both the second chip and the third chip are mounted on and electrically connected to the first chip through the electrical interconnections of the plurality of through silicon plugs respectively.

15. The semiconductor package structure as claimed in claim 1, further comprising:
an insulating adhesive layer, being formed on the first chip stack structure; and
a second chip stack structure, being attached to the first chip stack structure by the insulating adhesive layer, in which the second chip stack structure comprises a plurality of chips, each of the chips having an upper surface, a bottom surface opposite to the upper surface, and a plurality of through silicon plugs disposed therein to form electrical interconnections between the upper surface and the bottom surface, each of the through silicon plugs comprising a first electrode jutting out from one of the upper surface or the bottom surface of the chip, and the plurality of through silicon plugs of two adjacent chips being electrically connected through the first electrodes respectively;
wherein the first chip stack structure and the second chip stack structure are electrically isolated by the insulating adhesive layer.

16. The semiconductor package structure as claimed in claim 15, wherein the second chip stack structure is electrically connected to the substrate unit by wire bonding.

17. The semiconductor package structure as claimed in claim 1, wherein the first chip stack structure further comprises a spacer being disposed between two adjacent chips.

18. The semiconductor package structure as claimed in claim 15, further comprising a plurality of passive components being formed on at least one of the plurality of chips or on the substrate unit.

19. A method for manufacturing a semiconductor package structure, comprising the following steps of:
providing a substrate, the substrate comprising a plurality of substrate units, each of the substrate units comprising a circuit structure formed thereon and a chip mounting area defined thereupon, the circuit structure having a plurality of bonding pads and a plurality of test pads, each of the bonding pads being arranged within the chip mounting area and connected to each of the test pads, and the test pads being arranged outside of the chip mounting area;
forming a first sealing layer on the chip mounting area;
attaching a first chip on the chip mounting area by the first sealing layer, the first chip having a first upper surface, a first bottom surface and a plurality of through silicon plugs disposed therein to form electrical interconnections between the first upper surface and the first bottom surface, each of the through silicon plugs comprising a first electrode jutting out from one of the first upper surface or the first bottom surface;
electrically connecting at least a portion of the plurality of through silicon plugs of the first chip to the bonding pads, wherein a space between the first chip and the substrate unit is filled by the first sealing layer;
forming a second sealing layer on the first upper surface;
attaching a second chip on the first upper surface by the second sealing layer, the second chip having a second upper surface, a second bottom surface and a plurality of through silicon plugs disposed therein to form electrical interconnections between the second upper surface and the second bottom surface, each of the through silicon plugs comprising a second electrode jutting out from one of the second upper surface or the second bottom surface; and
electrically connecting at least a portion of the plurality of through silicon plugs of the second chip to the corresponding through silicon plugs of the first chip, wherein a space between the first chip and the second chip is filled by the second sealing layer.

20. The method as claimed in claim 19, after each of the electrically connecting steps, further comprising a testing step, wherein a test signal is applied to the test pads for evaluating the electrical interconnection between the first chip and the substrate unit and between the first chip and the second chip.

21. The method as claimed in claim 20, after the testing step, further comprising a redundancy repairing step when required to increase a yield of the semiconductor package structure.

22. The method as claimed in claim 20, after the last testing step, further comprising a step of removing the substrate unit.

23. The method as claimed in claim 20, after the last testing step, further comprising a step of removing the test pads by punching, sawing or routing.

24. The method as claimed in claim 19, wherein the first electrically connecting step comprises a step of bonding the first electrodes to the bonding pads respectively by thermo-compressing, thermo-sonic bonding, ultrasonic bonding or a combination thereof, and the second electrically connecting step comprises a step of bonding the second electrodes to the through silicon plugs of the first chip respectively by thermo-compressing, thermo-sonic bonding, ultrasonic bonding or a combination thereof.

25. The method as claimed in claim 24, wherein the first and second sealing layers are made of a material selected from the following group of: non-conductive paste (NCP), non-conductive film (NCF), anisotropic conductive paste (ACP), anisotropic conductive film (ACF), underfill, non-flow underfill, B-stage gel, molding compound, film-on-wire (FOW), and a combination thereof.

26. The method as claimed in claim 19, wherein the step of providing a substrate further comprises a step of continuously transporting the plurality of substrate units.

27. The method as claimed in claim 26, wherein the continuously transporting step comprises one of reel-to-reel transporting, strip-to-strip transporting, and panel-to-panel transporting.

28. A semiconductor package structure, comprising:
a first semiconductor chip having a first upper surface, a first bottom surface, a plurality of test pads, a first chip mounting area defined on the first upper surface and a plurality of through silicon plugs disposed therein to form electrical interconnections between the first upper surface and the first bottom surface, each of the through silicon plugs comprising a first electrode jutting out from one of the first upper surface or the first bottom surface, each of the test pads being arranged outside of the first chip mounting area and connected to each of the through silicon plugs;
a second semiconductor chip having a second upper surface, a second bottom surface, a plurality of test pads, a second chip mounting area defined on the second upper surface and a plurality of through silicon plugs disposed therein to form electrical interconnections between the second upper surface and the second bottom surface, each of the through silicon plugs comprising a second electrode jutting out from one of the second upper surface or the second bottom surface, each of the test pads being arranged outside of the second chip mounting area and connected to each of the through silicon plugs; and
wherein the second semiconductor chip is mounted on the first chip mounting area and at least a portion of the plurality of through silicon plugs of the second semiconductor chip are electrically connected to the corresponding through silicon plugs of the first semiconductor chip.

29. The semiconductor package structure as claimed in claim 28, wherein the first semiconductor chip and the second semiconductor chip further comprise a plurality of connecting circuits for connecting the through silicon plugs and the test pads.

30. The semiconductor package structure as claimed in claim 29, wherein the connecting circuits are covered with an isolating protection layer.

31. The semiconductor package structure as claimed in claim 28, further comprising a sealing layer being formed between the first semiconductor chip and the second semiconductor chip for filling a space therebetween.

32. The semiconductor package structure as claimed in claim 31, wherein the sealing layer is made of a material is selected from the following group: non-conductive paste (NCP), non-conductive film (NCF), anisotropic conductive paste (ACP), anisotropic conductive film (ACF), underfill, non-flow underfill, B-stage gel, molding compound, film-on-wire (FOW), and a combination thereof.

33. The semiconductor package structure as claimed in claim 28, wherein the through silicon plugs are made of a material selected from the following group: Cu, Au, Ag, Sn, Sn/Pb, Sn/Ag alloy, Sn/Ag/Cu alloy, lead-free solder, Ni/Au alloy, Ni/Pd alloy, Ni/Pd/Au alloy, W, poly Si, doped Si, conductive polymer and a combination thereof.

34. The semiconductor package structure as claimed in claim 28, wherein the first electrodes and the second electrodes are portions of the through silicon plugs.

35. The semiconductor package structure as claimed in claim 28, wherein the first electrodes and the second electrodes are conductive polymer bumps, plated bumps, electro-less plated bumps, stud bumps, or metal composite bumps made of a material selected from the group of: Cu, Au, Ag, In, Ni/Au, Ni/Pd/Au, Cu/Ni/Au, Cu/Au, Al and a combination thereof.

36. A method for manufacturing a semiconductor package structure, comprising the following steps of:
providing a first semiconductor element comprising at least one chip, the at least one chip having a first upper surface, a first bottom surface, a plurality of test pads, a first chip mounting area defined on the first upper surface and a plurality of through silicon plugs disposed therein to form electrical interconnections between the first upper surface and the first bottom surface, each of the through silicon plugs comprising a first electrode jutting out from one of the first upper surface or the first bottom surface, each of the test pads being arranged outside of the first chip mounting area and connected to each of the through silicon plugs;
forming a first sealing layer on the first chip mounting area;
attaching a second semiconductor element on the first chip mounting area by the first sealing layer, the second semiconductor element having a second upper surface, a second bottom surface, a plurality of test pads, a second chip mounting area defined on the second upper surface and a plurality of through silicon plugs disposed therein to form electrical interconnections between the second upper surface and the second bottom surface, each of the through silicon plugs comprising a second electrode jutting out from one of the second upper surface or the second bottom surface, each of the test pads being arranged outside of the second chip mounting area and connected to each of the through silicon plugs; and
electrically connecting at least a portion of the plurality of through silicon plugs of the second semiconductor element to the corresponding through silicon plugs of the first semiconductor element, wherein a space between the first semiconductor element and the second semiconductor element is filled by the first sealing layer.

37. The method as claimed in claim 36, after the electrically connecting step, further comprising a testing step, wherein a test signal is applied to the test pads for evaluating the electrical interconnection between the first semiconductor element and the second semiconductor element.

38. The method as claimed in claim 37, after the testing step, further comprising a redundancy repairing step when required to increase a yield of the semiconductor package structure.

39. The method as claimed in claim 36, wherein the electrically connecting step comprises a step of bonding the first electrodes to the through silicon plugs of the second semiconductor element respectively, bonding the second electrodes to the through silicon plugs of the first semiconductor element respectively or bonding the second electrodes to the first electrodes respectively by thermo-compressing, thermosonic bonding, ultrasonic bonding or a combination thereof.

40. The method as claimed in claim 36, wherein the first semiconductor element and the second semiconductor element are chips.

41. The method as claimed in claim 36, wherein the first semiconductor element is a wafer comprising a plurality of chips.

42. The method as claimed in claim 41, after the electrically connecting step, further comprising the step of singulating the first semiconductor element to form a plurality of individual chip stack structures having a first chip of the first semiconductor element and a second chip of the second semiconductor element.

43. The method as claimed in claim 42, further comprising the steps of:
   providing a substrate, the substrate comprising a plurality of substrate units;
   forming a second sealing layer on the substrate units;
   attaching the plurality of chip stack structures on the substrate units by the second sealing layer; and
   electrically connecting at least a portion of the plurality of through silicon plugs of the first chips to the substrate units, wherein spaces between the chip stack structures and the substrate units are filled by the second sealing layer.

44. The method as claimed in claim 43, wherein the first and second sealing layers are selected from the following group of: non-conductive paste (NCP), non-conductive film (NCF), anisotropic conductive paste (ACP), anisotropic conductive film (ACF), underfill, non-flow underfill, B-stage gel, molding compound, film-on-wire (FOW), and a combination thereof.

* * * * *

UNITED STATES PATENT AND TRADEMARK OFFICE
CERTIFICATE OF CORRECTION

PATENT NO. : 7,973,310 B2  
APPLICATION NO. : 12/501100  
DATED : July 5, 2011  
INVENTOR(S) : David Wei Wang et al.

Page 1 of 1

It is certified that error appears in the above-identified patent and that said Letters Patent is hereby corrected as shown below:

IN THE SPECIFICATION

In column 1, line 6, delete "098100319" and insert --098100219--.

Signed and Sealed this  
Twenty-fourth Day of December, 2013

Margaret A. Focarino  
*Commissioner for Patents of the United States Patent and Trademark Office*